United States Patent
Shiba

[11] Patent Number: 5,927,305
[45] Date of Patent: *Jul. 27, 1999

[54] CLEANING APPARATUS

[75] Inventor: Kazuhiko Shiba, Shizuoka, Japan

[73] Assignee: Pre-Tech Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/802,606

[22] Filed: Feb. 19, 1997

[30] Foreign Application Priority Data

Feb. 20, 1996 [JP] Japan .................................. 8-031986
Apr. 9, 1996 [JP] Japan .................................. 8-086808

[51] Int. Cl.$^6$ ...................................................... B08B 3/02
[52] U.S. Cl. ........................ 134/153; 134/144; 134/902
[58] Field of Search .................. 134/902, 144, 134/153; 156/345 L, 345 LS; 118/52

[56] References Cited

U.S. PATENT DOCUMENTS

| | | | |
|---|---|---|---|
| 4,489,740 | 12/1984 | Rattan et al. | 134/902 X |
| 5,351,360 | 10/1994 | Suzuki et al. | 134/902 X |
| 5,361,449 | 11/1994 | Akimoto | 134/153 X |
| 5,584,310 | 12/1996 | Bergman et al. | 134/153 X |
| 5,706,843 | 1/1998 | Matsuo | 134/153 |

FOREIGN PATENT DOCUMENTS

| | | | |
|---|---|---|---|
| 188323 | 8/1987 | Japan | 134/902 |
| 185029 | 7/1988 | Japan | 134/902 |
| 286424 | 11/1989 | Japan | 134/902 |
| 197126 | 8/1990 | Japan | 134/902 |
| 14230 | 1/1991 | Japan | 134/902 |
| 218016 | 9/1991 | Japan | 134/902 |
| 213827 | 8/1992 | Japan | 134/902 |
| 3184 | 1/1993 | Japan | 134/902 |
| 8-86808 | 4/1996 | Japan . | |

*Primary Examiner*—Philip R. Coe
*Attorney, Agent, or Firm*—Nixon & Vanderhye

[57] ABSTRACT

A cleaning apparatus is disclosed which is capable of simultaneously and precisely cleaning two sides of a substrate required to be cleaned, such as a silicon wafer. The cleaning apparatus has a holding unit for horizontally holding a substrate required to be cleaned, a rotating unit for rotating the holding unit, a first cleaning-fluid injection unit disposed above the holding unit and arranged to inject cleaning fluid with high-frequency acoustic waves to the surface of the substrate supported by the holding unit and a second cleaning-fluid injection unit disposed below the holding unit and arranged to inject cleaning fluid to the reverse side of the substrate supported by the holding unit.

3 Claims, 9 Drawing Sheets

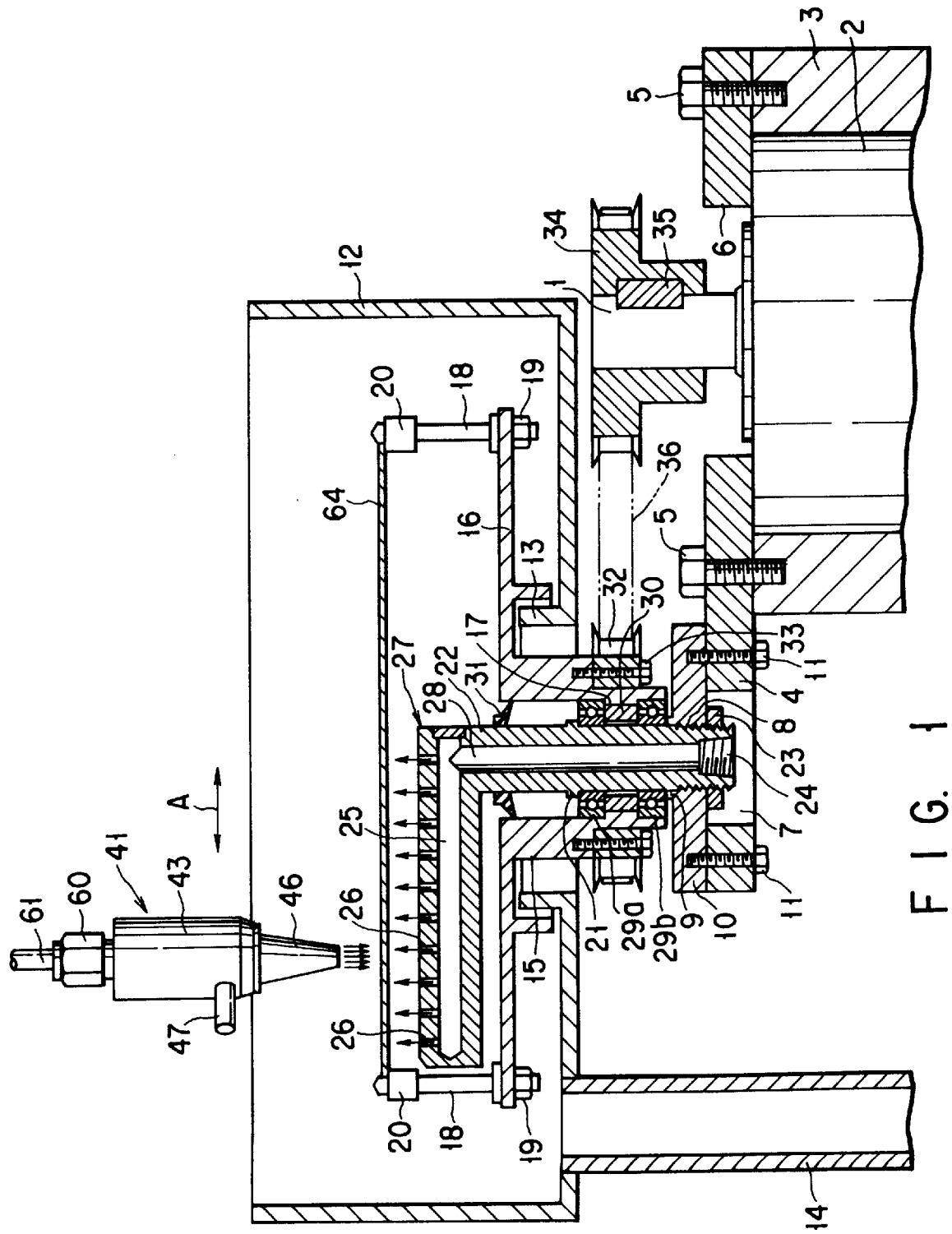
F I G. 1

CLEANING APPARATUS

BACKGROUND OF THE INVENTION

The present invention relates to a cleaning apparatus for cleaning a substrate, such as a liquid crystal glass substrate, semiconductor wafer, a magnetic disk or the like, required to be cleaned.

Hitherto, subjects required to be cleaned, such as liquid crystal glass substrates, semiconductor wafer or magnetic disks, have been cleaned such that a plurality of the substrates are stood erect in a processing chamber, and then cleaning fluid is poured into the processing chamber, followed by operating an oscillator disposed in the bottom portion of the processing chamber to radiate high-frequency acoustic waves to the cleaning fluid so that the plural substrates in the processing chamber are cleaned at a stretch.

However, the trend of enlargement of the liquid crystal glass substrate and that of the diameter of semiconductor wafer arise a difficulty for the above-mentioned method to uniformly clean the overall surface of the substrate required to be cleaned. Thus, there arises a problem in that the cleaning process suffers from irregular results. Since thin film transistors, to be formed on the liquid crystal glass substrate, and devices, to be formed on the semiconductor wafer, have been fined and mounted densely, the reverse side of the substrate must precisely be cleaned as well as the right side (the side on which the devices and so forth will be formed) of the substrate.

Therefore, substrates (for example, silicon wafer) required to be cleaned are transferred by a single transfer method to clean the substrate on the transfer passage by rinse shower, chemical scrub, pure water scrub, a high-frequency cleaning nozzle, pure water shower and spin drying.

However, since the scrub cleaning process is performed by mechanically bringing a pair of sponge-type rolls into contact with the two sides of the silicon wafer, there arises a problem in that the two sides of the wafer are damaged or contamination particles are allowed to again adhere to the two sides and thus the two sides are again contaminated.

BRIEF SUMMARY OF THE INVENTION

An object of the present invention is to provide a high-frequency cleaning apparatus which is capable of simultaneously and precisely cleaning two sides of a substrate, such as silicon wafer, required to be cleaned.

Another object of the present invention is to provide a cleaning apparatus which is capable of preventing re-contamination of a substrate, such as silicon wafer, required to be cleaned, occurring due to splash of cleaning fluid without a necessity of using a large size shielding member.

According to one aspect of the present invention, there is provided a cleaning apparatus comprising:
holding means for horizontally holding a substrate required to be cleaned;
rotating means for rotating the holding means;
first cleaning-fluid injection means disposed above the holding means and arranged to inject cleaning fluid with high-frequency acoustic waves to the surface of the substrate supported by the holding means; and
second cleaning-fluid injection means disposed below the holding means and arranged to inject cleaning fluid to the reverse side of the substrate supported by the holding means.

According to another aspect of the present invention, there is provided a cleaning apparatus comprising:
holding means for horizontally holding a substrate required to be cleaned;
shielding member having a cylindrical side wall for shielding a peripheral space of the holding means;
rotating means for integrally rotating the holding means and the shielding member; and
cleaning-fluid injection means for injecting cleaning fluid to the surface of the substrate held by the holding means.

According to another aspect of the present invention, there is provided a cleaning apparatus comprising:
holding means for horizontally holding a substrate required to be cleaned;
shielding member in the form of a cylindrical shape having a bottom so as to shield a peripheral space of the holding means;
rotating means for integrally rotating the holding means and the shielding member;
different-pressure generating member having a plurality of openings, at the same intervals, formed in the periphery of the bottom portion of the shielding member or in the side wall adjacent to the bottom portion of the shielding member; and
cleaning-fluid injection means for injecting cleaning fluid to the surface of the substrate held by the holding means.

According to another aspect of the present invention, there is provided a cleaning apparatus comprising:
holding means for horizontally holding a substrate required to be cleaned;
shielding member in the form of a cylindrical shape having a bottom so as to shield a peripheral space of the holding means;
rotating means for integrally rotating the holding means and the shielding member;
first different-pressure generating member having a plurality of openings, at the same intervals, formed in the periphery of the bottom portion of the shielding member or in the side wall adjacent to the bottom portion of the shielding member and different pressure pipes respectively communicated with the openings and having openings facing opposite to a direction of rotation of the shielding member;
second different-pressure generating member having a plurality of openings, at the same intervals, formed adjacent to the central portion of the bottom portion of the shielding member and different pressure pipes respectively communicated with the openings and having openings facing the direction of the rotation of the shielding member; and
cleaning-fluid injection means for injecting cleaning fluid to the surface of the substrate held by the holding means.

According to another aspect of the present invention, there is provided a cleaning apparatus comprising:
holding means for horizontally holding a substrate required to be cleaned;
rotating means for rotating the holding means;
first cleaning-fluid injection means disposed below the holding means to zonally inject cleaning fluid with high-frequency acoustic waves to the reverse side of the substrate supported by the holding means; and second cleaning-fluid injection means disposed above the holding means to inject cleaning fluid to the right side of the substrate supported by the holding means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a cross sectional view showing a cleaning apparatus according to a first embodiment of the present invention;

DETAILED DESCRIPTION OF THE INVENTION

Figure 2:
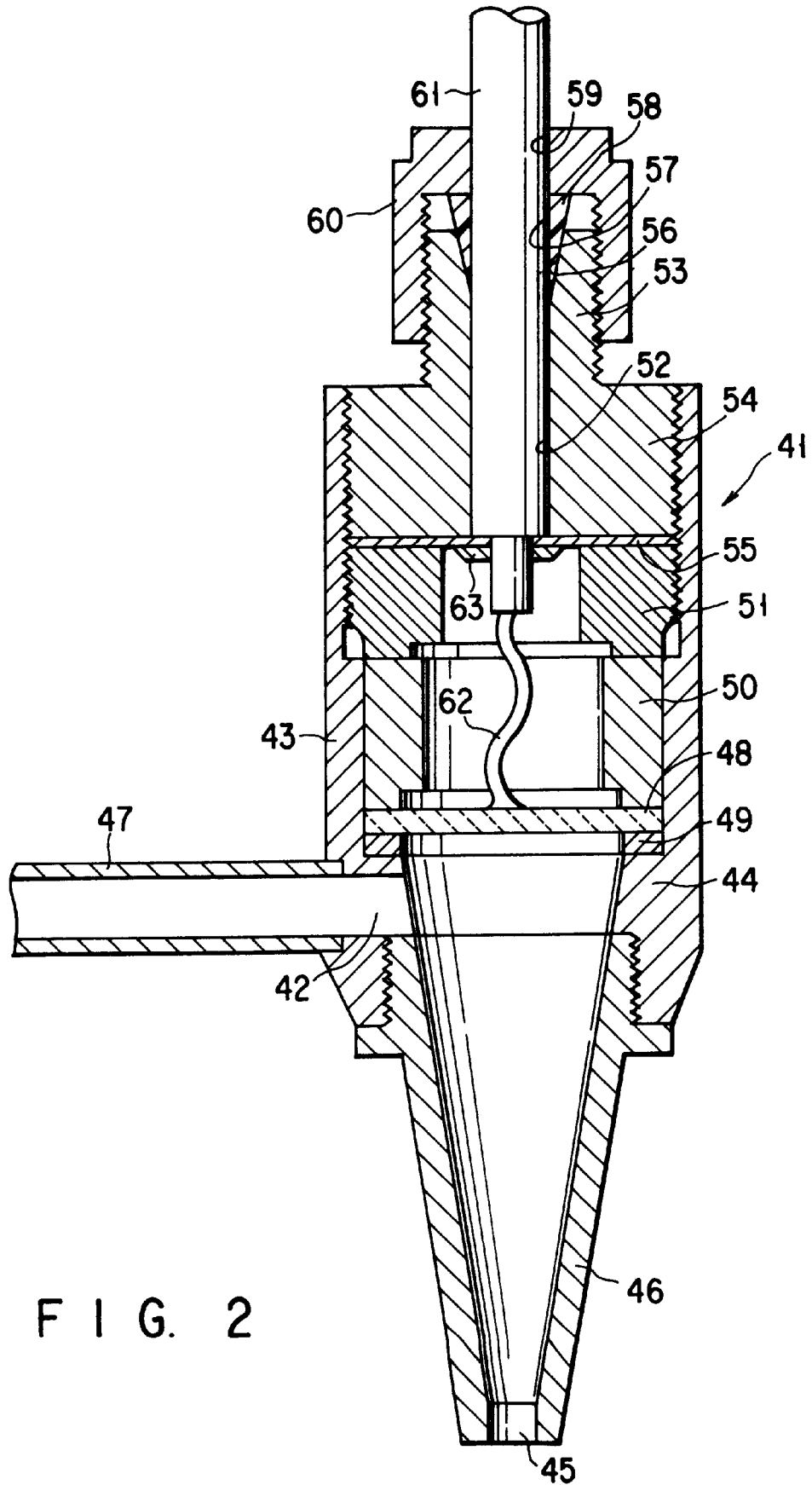
FIG. 2 is a cross sectional view showing a high-frequency oscillation nozzle (a first cleaning-fluid injection means) for use in the cleaning apparatus shown in FIG. 1.

A cleaning apparatus according to the present invention will now be described.

The cleaning apparatus according to the present invention has a holding means for horizontally holding a substrate required to be cleaned. The holding means is rotated by a rotating means. A high-frequency oscillation nozzle, which is a first cleaning-fluid injection means for injecting cleaning fluid with high-frequency acoustic waves to the surface of the substrate held by the holding means, is disposed above the holding means. The second cleaning-fluid injection means for injecting cleaning fluid to the reverse side of the substrate held by the holding means is disposed below the holding means.

The high-frequency oscillation nozzle (the first cleaning-fluid injection means) may be a cylindrical nozzle having a structure which is reciprocated in a direction of the radius of the substrate from the center of rotation of the substrate or a so-called bar type nozzle in the form of a rectangle having an elongated cleaning-fluid discharge portion.

The holding means is rotatively engaged to a cylindrical fixed shaft, for example, also serving as a portion for supplying cleaning fluid, the holding means having a structure provided with a rotation support member for horizontally supporting the substrate required to be cleaned.

The rotating means has a structure having a pipe-shape fixed shaft also serving as, for example, a portion for supplying the cleaning fluid and a drive mechanism for rotating the rotation support member around the fixed shaft. The drive mechanism has a follower timing pulley attached to the rotation support member, a drive timing pulley, a timing belt arranged between the pulleys and a motor for rotating the drive timing pulley.

The second cleaning-fluid injection means is a shower nozzle integrally and horizontally connected to the cylindrical fixed shaft also serving as, for example, a portion for supplying the cleaning fluid, having a cleaning-fluid passage portion communicated with a hollow portion of the fixed shaft and, in the upper portion thereof, provided with a plurality of cleaning-fluid injection ports communicated with the passage portion.

The cleaning apparatus according to the present invention may have a structure further comprising a shielding member having a cylindrical side wall for shielding a peripheral space of the holding means, wherein the rotating means has a structure for integrally rotating the holding means and the shielding member.

In the above-mentioned cleaning apparatus according to the present invention, when cleaning fluid with high-frequency acoustic waves capable of penetrating a substrate such as semiconductor wafer, required to be cleaned horizontally held by the holding means, is injected from the first cleaning-fluid injection means, for example, a cylindrical high-frequency oscillation nozzle disposed above the semiconductor wafer to the surface of the semiconductor wafer while reciprocating the high-frequency oscillation nozzle in a direction of the radius of the wafer from the center of rotation of the wafer and rotating the semiconductor wafer by the rotating means, the cleaning fluid with the high-frequency acoustic waves is injected from the high-frequency oscillation nozzle to the overall surface of the semiconductor wafer. Therefore, particles on the surface of the semiconductor wafer can be cleaned with the cleaning fluid. Thus, re-adhesion of particles can be prevented and, therefore, the semiconductor wafer can precisely be cleaned.

When cleaning fluid is injected from the second cleaning-fluid injection means, for example, the shower nozzle, disposed below the semiconductor wafer to the reverse side of the semiconductor wafer simultaneously with injecting cleaning fluid with high-frequency acoustic waves from the high-frequency oscillation nozzle to the surface of the semiconductor wafer, high-frequency acoustic waves emitted from the high-frequency oscillation nozzle penetrate the semiconductor wafer and act on particles existing on the reverse side of the semiconductor wafer. Thus, particles can be cleaned by the liquid film of the cleaning fluid injected from the shower nozzle. At this time, high-frequency acoustic waves propagated to the liquid film are reflected by the air layer having a considerably different acoustic impedance, and then allowed to pass through the semiconductor wafer while acting on the particles on the reverse side of the semiconductor wafer to return to the right side of the semiconductor wafer. High-frequency acoustic waves returned to the right side of the semiconductor wafer are reflected by the interface between the liquid film on the surface of the semiconductor wafer and the air layer. Then, the high-frequency acoustic waves are repeatedly reflected similarly to the above-mentioned process, and then decays. As described above, injection of the cleaning fluid from the shower nozzle to the reverse side of the silicon wafer and the formed liquid film enable the two sides of the semiconductor wafer to simultaneously and precisely be cleaned without a necessity of disposing a high-frequency oscillation nozzle below the wafer, too.

It is preferable that the frequency of high-frequency acoustic waves penetrating the semiconductor wafer be adjusted to have a wavelength of ½λ of the resonant frequency of the semiconductor wafer. Specifically, in a case where the semiconductor wafer has a diameter of 5 inches (a thickness of 0.55 mm) and the acoustic velocity is assumed to be 8000 m/sec, the frequency is set to be integer times 7.27 MHz. In a case where the semiconductor wafer has a diameter of 6 inches (a thickness of 0.65 mm) and the acoustic velocity is assumed to be 8000 m/sec, the frequency is set to be integer times 6.15 MHz. In a case where the semiconductor wafer has a diameter of 8 inches (a thickness of 0.75 mm) and the acoustic velocity is assumed to be 8000 m/sec, the frequency is set to be integer times 5.33 MHz.

Another cleaning apparatus according to the present invention will now be described.

The cleaning apparatus according to the present invention has a holding means for horizontally holding a substrate required to be cleaned. A shielding member having a cylindrical side wall is disposed to shield a peripheral space of the holding means. The holding means and the shielding member are integrally rotated by the rotating means. Cleaning fluid is injected from a cleaning-fluid injection means to the surface of the substrate held by the holding means.

Examples of the cleaning-fluid injection means are a shower nozzle, a high-frequency oscillation nozzle or the like. When a nozzle body, serving as the cleaning-fluid injection means, includes an oscillator disposed to be opposite to the discharge port of the nozzle and the structure is formed such that cleaning fluid is supplied to the body of the nozzle through a pipe for supplying cleaning fluid so as to inject cleaning fluid with high-frequency acoustic waves to the rotating substrate required to be cleaned, the surface of the substrate can precisely be cleaned.

The cleaning-fluid injection means may be structured to be reciprocated between the center of the substrate held by the holding means and the periphery of the substrate. By reciprocating the cleaning-fluid injection means, the overall surface of the substrate required to be cleaned can satisfactorily be cleaned.

In the above-mentioned a cleaning apparatus according to another aspect of the present invention, a substrate, such as a silicon wafer, required to be cleaned is held by the holding means and the holding means and the shielding member having a cylindrical side wall for shielding a space around the holding means are integrally (synchronously) rotated by the rotating means. When cleaning fluid, for example, pure water, is injected from the cleaning-fluid injection means to the rotating substrate, the surface of the substrate can satisfactorily be cleaned.

When cleaning fluid is injected to the substrate from the cleaning-fluid injection means, cleaning fluid is splashed on the surface of the substrate. Cleaning fluid splashed in the horizontal direction including the direction of the tangent of the locus of rotation of the substrate collides with the inner surface of the cylindrical side wall of the shielding member disposed around the substrate. When cleaning fluid collides with the inner surface of the cylindrical side wall of the shielding member, the shielding member, which is being rotated integrally with the holding means for holding the substrate, acts to moderate the collision of the cleaning fluid. Thus, return of splash to the substrate can be prevented. Thus, contamination of the substrate with the cleaning fluid attributable to re-adhesion of the cleaning fluid can be prevented.

A cleaning apparatus according to another aspect of the present invention will now be described.

The cleaning apparatus has a holding means for horizontally holding a substrate required to be cleaned. A shielding member having a cylindrical side wall is disposed on the outside of the holding means to shield a space around the holding means. The holding means and the shielding member are integrally rotated by a rotating means. A different-pressure generating member having a plurality of openings formed at the same intervals is formed in the periphery of the bottom portion of the shielding member or in the side wall adjacent to the bottom portion. Cleaning fluid is injected from the cleaning-fluid injection means to the surface of the substrate held by the holding means.

It is preferable that the different-pressure generating member comprises the plurality of openings, at the same intervals, formed in the periphery of the bottom portion of the shielding member or in the side wall adjacent to the bottom portion and different pressure pipes respectively communicated with the openings.

Examples of the cleaning-fluid injection means are a shower nozzle, a high-frequency oscillation nozzle or the like. When a nozzle body, serving as the cleaning-fluid injection means, includes an oscillator disposed to be opposite to the discharge port of the nozzle and the structure is formed such that cleaning fluid is supplied to the body of the nozzle through a pipe for supplying cleaning fluid so as to inject cleaning fluid with high-frequency acoustic waves to the rotating substrate required to be cleaned, the surface of the substrate can precisely be cleaned.

The cleaning-fluid injection means may be structured to be reciprocated between the center of the substrate held by the holding means and the periphery of the substrate. By reciprocating the cleaning-fluid injection means, the overall surface of the substrate required to be cleaned can satisfactorily be cleaned.

In the above-mentioned a cleaning apparatus according to another aspect of the present invention, a substrate, for example, semiconductor wafer, required to be cleaned is held by a holding means and the shielding member having a cylindrical side wall for shielding the space around the holding means are integrally (synchronously) rotated by the rotating means. When cleaning fluid, for example, pure water is injected from the cleaning-fluid injection means to the substrate, the surface of the substrate can satisfactorily be cleaned.

When the holding means and the shielding member in the form of a cylinder having a bottom are integrally rotated by the rotating means, the different-pressure generating member, having a plurality of openings, at the same intervals, formed in the periphery of the bottom portion of the shielding member for shielding the space around the holding means or in the side wall adjacent to the bottom portion, causes air in the shielding member in the form of the cylinder having the bottom to be discharged through the plural openings. Thus, airflows are generated from the center of the rotating substrate to the periphery of the same. When the structure is formed such that the different-pressure generating member comprises the plural openings, at the same intervals, formed in the periphery of the bottom portion of the shielding member or in the side wall adjacent to the bottom portion and different pressure pipes respectively communicated with the openings and having, at the lower ends thereof, openings formed to be opposite to the direction of the rotation of the shielding member, the air pressure adjacent to the different pressure pipes is lowered when the shielding member is rotated. Thus, air in the shielding member in the form of the cylinder having the bottom is sucked through the lower end openings so as to be discharged. Therefore, strong airflows are generated from the center of the rotating substrate toward the periphery of the substrate. As a result, cleaning fluid injected to the substrate and splashed by the surface of the substrate does not substantially reach the inner surface of the cylindrical side wall. The cleaning fluid is, by the airflow generated by the different-pressure generating member from the center of the substrate toward the periphery of the same, forcibly discharged to the plural openings of the different-pressure generating member. Even if a portion of the cleaning fluid is splashed by the surface of the substrate, in particular, even if cleaning fluid splashed in the horizontal direction including the direction of the tangent of the locus of the rotation of the substrate collides with the inner surface of the cylindrical side wall, the shielding member, which is being rotated integrally with the holding means, acts to moderate the collision of the cleaning fluid. Thus, return of the splash of the cleaning fluid to the substrate can be prevented.

The above-mentioned integral rotation of the holding means and the shielding member and provision of the different-pressure generating member for the shielding member efficiently prevent re-adhesion of the cleaning fluid to the cleaned substrate and contamination of the substrate.

A cleaning apparatus according to another aspect of the present invention will now be described.

The cleaning apparatus has a holding means for horizontally holding a substrate required to be cleaned. A shielding member having a cylindrical side wall is disposed on the outside of the holding means to shield a space around the holding means. The holding means and the shielding member are integrally rotated by a rotating means. A first different-pressure generating member is disposed in the periphery of the bottom portion of the shielding member or the side wall adjacent to the bottom portion. The first different-pressure generating member comprises a plurality of openings formed at the same intervals and different pressure pipes respectively communicated with the openings and having, at the lower ends thereof, openings formed to be opposite to the direction of the rotation of the shielding member. A second different-pressure generating member is disposed adjacent to the central portion of the bottom portion of the shielding member. The second different-pressure generating member comprises a plurality of openings formed at the same intervals and different pressure pipes respectively communicated with the openings and having, at the lower ends thereof, openings formed to be faced the direction of the rotation of the shielding member. Cleaning fluid is injected from the cleaning-fluid injection means to the surface of the substrate held by the holding means.

The cleaning-fluid injection means may be a shower nozzle, a high-frequency oscillation nozzle or the like. When a nozzle, serving as the cleaning-fluid injection means and having a body including an oscillator disposed to be opposite to the discharge portion of the nozzle, is provided and cleaning fluid is arranged to be supplied into the body through a pipe for supplying cleaning fluid so as to inject the cleaning fluid with high-frequency acoustic waves to the substrate required to be cleaned, the surface of the substrate can precisely be cleaned.

The cleaning-fluid injection means may be structured to be reciprocated from the central portion of the substrate held by the holding means and the periphery of the substrate. By reciprocating the cleaning-fluid injection means, the overall surface of the substrate required to be cleaned can satisfactorily be cleaned.

In the above-mentioned a cleaning apparatus according to another aspect of the present invention, a substrate, such as wafer, required to be cleaned is held by the holding means and the holding means and the shielding member having the cylindrical side wall for shielding the space around the holding means are integrally (synchronously) rotated by the rotating means. In this state, cleaning fluid, for example, pure water is injected from the cleaning-fluid injection means to the substrate. Thus, the surface of the substrate can satisfactorily be cleaned.

When the holding means and the shielding member in the form of the cylinder having the bottom are integrally rotated by the rotating means, the first different-pressure generating member disposed in the periphery of the bottom portion of the shielding member for shielding the space around the holding means or in the side wall adjacent to the bottom portion lowers the air pressure adjacent to the different pressure pipes having, at the lower ends thereof, opening formed to be opposite to the direction of the rotation of the shielding member when the shielding member is rotated. Thus, air in the shielding member in the form of the cylinder having the bottom is sucked through the lower end openings of the different pressure pipes so as to be discharged. As a result, strong airflows are generated from the center of the surface of the rotating substrate toward the periphery of the substrate. When the holding means and the shielding member are integrally rotated by the rotating means, the second different-pressure generating member disposed adjacent to the central portion of the bottom portion of the shielding member raises the air pressure adjacent to the openings formed at the lower ends of the different pressure pipes of the second different-pressure generating member to be faced the direction of the rotation of the shielding member. That is, the air pressure is raised to be higher than hat in the shielding member. Thus, air is introduced into the shielding member through the different pressure pipes and the openings. As a result, strong airflows are generated from positions adjacent to the central portion of the reverse side of the rotating substrate to the plural openings of the second different-pressure generating member through the periphery of the substrate.

Hence, the cleaning fluid injected to the substrate required to be cleaned and splashed by the surface of the substrate does not substantially reach the inner surface of the cylindrical side wall. The cleaning fluid is, by the airflow generated by the first different-pressure generating member from the center of the substrate required to be cleaned to the periphery of the substrate, forcibly discharged to the plural openings of the first different-pressure generating member. Simultaneously, introduction of the splashed cleaning fluid to the reverse side of the substrate by the airflow generated by the second different-pressure generating member from positions adjacent to the central portion of the reverse side of the substrate to the periphery of the substrate can be prevented.

Even if a portion of the cleaning fluid is splashed by the surface of the substrate, in particular, even if the cleaning fluid splashed in the horizontal direction including the direction of the tangent of the locus of the rotation of the substrate collides with the inner surface of the cylindrical wall portion of the shielding member, the shielding member, which is being integrally rotated together with the holding means for holding the substrate, acts to moderate the collision of the cleaning fluid. Thus, return of the splash of the cleaning fluid to the substrate can be prevented.

Consequently, the integral rotation of the holding means and the shielding member and provision of the first and second different-pressure generating members for the shielding member prevent re-adhesion of the cleaning fluid used to clean the substrate to the substrate and contamination of the substrate can be prevented.

Another aspect of the cleaning apparatus according to the present invention will now be described.

The cleaning apparatus according to this aspect has a holding means for horizontally holding a substrate required to be cleaned. The holding means is rotated by a rotating means. A bar-type high frequency oscillation nozzle, serving as a first cleaning-fluid injection means for injecting cleaning fluid formed into an elongated shape with high-frequency acoustic waves to the reverse side of the substrate held by the holding means, is disposed below the holding means. A second cleaning-fluid injection means for injecting cleaning fluid to the right side of the substrate held by the holding means is disposed above the holding means.

The holding means has a structure, for example, having a rotation support member rotatively engaged to a cylindrical fixed shaft and arranged to horizontally hold the substrate required to be cleaned.

The rotating means has a structure, for example, having the cylindrical fixed shaft and a drive mechanism for rotating the rotation support member around the fixed shaft. The drive mechanism has, for example, a follower timing pulley attached to the rotation support member, a drive timing pulley, a timing belt arranged between the pulleys and a motor for rotating the drive timing pulley.

The bar-type high-frequency oscillation nozzle (the first cleaning-fluid injection means) has, for example, a rectangular block secured to the top end of the cylindrical fixed shaft and having a rectangular nozzle hole having, in the top surface thereof, an elongated cleaning-fluid discharge port, an oscillator disposed in the bottom portion of the nozzle hole to be opposite to the discharge port, and a cleaning fluid passage formed in the block to communicate with the nozzle hole. The oscillator is connected to a power supply cable introduced through the inner portion of the cylindrical fixed shaft. The passage is communicated with the cleaning-fluid supply pipe introduced through the inner portion of the cylindrical fixed shaft.

The second cleaning-fluid injection means may be a bar-type shower nozzle having a nozzle body having a plurality of injection ports opened downwards or a cylindrical shower nozzle having a cylindrical nozzle body having an injection port opened at the lower end thereof. In the case using the cylindrical shower nozzle, it is preferable that the nozzle is disposed above the center of the rotating substrate.

A cleaning apparatus according to another aspect of the present invention is permitted to have a structure such that a shielding member having a cylindrical side wall for closing a space around the holding means is disposed and the rotating means, the holding means and the shielding member are integrally rotated.

In the above-mentioned a cleaning apparatus according to another aspect of the present invention, the substrate such as semiconductor wafer, required to be cleaned and held by the holding means is horizontally rotated by the rotating means. In this state, zonal cleaning fluid is, with high-frequency acoustic waves capable of penetrating the wafer, injected to the reverse side of the semiconductor wafer through the elongated cleaning-fluid discharge port of the bar-type high-frequency oscillation nozzle disposed below the semiconductor wafer. At this time, the cleaning fluid with the high-frequency acoustic waves is injected to the overall reverse side of the semiconductor wafer from the high-frequency oscillation nozzle. Therefore, particles on the overall reverse side surface of the wafer can be cleaned and re-adhesion of the particles can be prevented so that precise cleaning is performed.

Simultaneously with the injection of the zonal cleaning fluid with the high-frequency acoustic waves from the high-frequency oscillation nozzle to the reverse side of the semiconductor wafer, cleaning fluid is, from the second cleaning-fluid injection means, for example, a shower nozzle, injected to the right side of the semiconductor wafer. As a result and similarly to the cleaning apparatus having the high-frequency oscillation nozzle disposed in the upper position and the shower nozzle disposed in the lower position, an operation such that high-frequency acoustic waves penetrate the semiconductor wafer from the reverse side and reflected high-frequency acoustic waves penetrate the semiconductor wafer from the right side to the reverse side is repeated. Thus, also the right side of the semiconductor wafer can simultaneously precisely be cleaned.

Therefore, the cleaning apparatus according to the other aspect of the present invention is able to simultaneously and precisely clean the two sides of the semiconductor wafer.

When the semiconductor wafer is cleaned with the high-frequency oscillation nozzle, it is generally advantageous that the oscillation nozzle is disposed adjacent to the semiconductor wafer to inject the cleaning fluid with the high-frequency acoustic waves in order to efficiently clean the semiconductor wafer. The cleaning apparatus according to the present invention enables the bar-type high-frequency oscillation nozzle disposed at the lower position to be located near the reverse side of the semiconductor wafer and the second cleaning-fluid injection means, for example, the shower nozzle disposed in the upper position to be disposed apart from the semiconductor wafer for a certain distance. As a result, the oscillation nozzle does not obstruct the operation for taking out the cleaned semiconductor wafer from the holding means as has been experienced with the structure in which the high-frequency oscillation nozzle is disposed at the upper position. As a result, the apparatus can easily be handled.

When the cylindrical high-frequency oscillation nozzle is disposed above the semiconductor wafer and the oscillation nozzle is moved in the radial direction of the semiconductor wafer by the drive member, there arises a risk that particles fall from the drive member to contaminate the semiconductor wafer. The cleaning apparatus according to the other aspect of the present invention has the structure such that the bar-type high-frequency oscillation nozzle is disposed below the semiconductor wafer. Therefore, the above-mentioned contamination of the semiconductor wafer attributable to particles above, experienced with the structure in which the cylindrical high-frequency oscillation nozzle arranged to perform a sweeping operation is disposed above the semiconductor wafer, can be prevented.

It is preferable that the frequency of high-frequency acoustic waves penetrating the semiconductor wafer be adjusted to have a wavelength of ½λ of the resonant frequency of the semiconductor wafer. Specifically, in a case where the semiconductor wafer has a diameter of 5 inches (a thickness of 0.55 mm) and the acoustic velocity is assumed to be 8000 m/sec, the frequency is set to be integer times 7.27 MHz. In a case where the semiconductor wafer has a diameter of 6 inches (a thickness of 0.65 mm) and the acoustic velocity is assumed to be 8000 m/sec, the frequency is set to be integer times 6.15 MHz. In a case where the semiconductor wafer has a diameter of 8 inches (a thickness of 0.75 mm) and the acoustic velocity is assumed to be 8000 m/sec, the frequency is set to be integer times 5.33 MHz.

The present invention will be described in detail by way of its example below.

(FIRST EMBODIMENT)

FIG. 1 is a cross sectional view of a cleaning apparatus according to a first embodiment of the present invention. FIG. 2 is a cross sectional view showing a high-frequency oscillation nozzle serving as a first cleaning-fluid injection means for use in the cleaning apparatus shown in FIG. 1.

A motor 2 having a drive shaft 1 extending in the vertical direction is accommodated in a cylindrical support member 3. A support plate 4 is secured to the upper surface of the cylindrical support member 3 with a plurality of screws 5. The support plate 4 has holes 6 and 7 respectively formed at positions corresponding to the drive shaft 1 and a portion extending from the cylindrical support member 3 to the left. A disc-like plate 10 having a hole 8 in the central portion thereof and an annular projection portion 9 formed around the hole 8 is secured to the upper surface of the support plate 4 by a plurality of screws 11 inserted from the lower surface of the support plate 4 toward the annular projection portion 9.

A processing chamber 12 is disposed above the disc-like plate 10. The processing chamber 12 has a cylindrical portion 13 in the form of a cylindrical shape having a bottom and upwards projecting over the central portion of the bottom portion of the processing chamber 12. A discharge pipe 14 is connected to the bottom portion adjacent to the side wall of the processing chamber 12. The processing chamber 12 is, by a frame (not shown), supported and secured in such a manner that the cylindrical portion 13 is disposed concentrically to the hole 8 of the disc-like plate 10.

A rotational disc 16, having a cylinder 15 downwards projecting in the central portion thereof, is disposed horizontally in the processing chamber 12. The cylinder 15 concentrically penetrates the cylindrical portion 13 of the processing chamber 12 to extend to the outside of the processing chamber 12. An annular engagement portion 17 horizontally projects over the inner surface of a lower portion of the cylinder 15. A plurality of, for example, four, support rods 18 having threads in the upper and lower portions thereof are inserted into the peripheral portion of the rotational disc 16 at the same angular degree (90°) to project vertically. By setting nuts 19 to the thread portions of the support rods 18 projecting over the lower surface of the rotational disc 16, the support rods 18 are secured to the rotational disc 16. Disc-like support blocks 20 are respectively engaged to the thread portions of the support rods 18 to be disposed horizontally.

A cylindrical fixed shaft 22, having an annular flange 21 at an intermediate portion thereof and provided with a thread portion in the outer surface of the lower portion thereof, is concentrically inserted into the cylinder 15 of the rotational disc 16 and then inserted into the hole 8 formed in the disc-like plate 10. The cylindrical fixed shaft 22 is secured to the disc-like plate 10 by fixing a nut 23 to a lower portion downwards projecting over the lower surface of the disc-like plate 10. A joint portion 24, arranged to join a cleaning-fluid supply pipe (not shown), is formed in the opening portion in the lower end oscillator of the cylindrical fixed shaft 22. As described above, the cleaning-fluid supply pipe is connected to the joint portion 24. A shower nozzle 27, formed in a cleaning-fluid passage 25, having a plurality of injection ports 26 formed in the lower portion thereof and serving as a second cleaning-fluid injection means extending in the horizontal direction, is located in a space surrounded by the four fixed support rods 18. The shower nozzle 27 is integrally formed at the leading end of the cylindrical fixed shaft 22 in such a manner that a hollow portion 28 of the shower nozzle 27 and the cleaning-fluid passage 25 are communicated with each other. Two bearings 29a and 29b are disposed in a space defined by the inner surface of the cylinder 15, the outer surface of the cylindrical fixed shaft 22, the annular flange 21 of the cylindrical fixed shaft 22 and the annular projection portion 9 of the disc-like plate 10, the bearings 29a and 29b being disposed vertically apart from each other for a required distance through an annular spacer 30. The lower surface of the bearing 29a is engaged to the upper surface of the annular engagement portion 17 formed in the inner surface adjacent to the lower portion of the cylinder 15, while the upper surface of the bearing 29b is engaged to the lower surface of the annular engagement portion 17. A rubber V-ring 31 is interposed between the inner surface of the upper portion of the cylinder 15 of the rotational disc 16 and the cylindrical fixed shaft 22 so as to prevent introduction of cleaning fluid injected from a shower nozzle, to be described later, into a space between the inner surface of the cylinder 15 and the cylindrical fixed shaft 22 in which the bearings 29a and 29b are disposed.

A follower timing pulley 32 is attached to the outer surface of the lower portion of the cylinder 15 by a plurality of screws 33 so that the follower timing pulley 32 is secured to the cylinder 15. A drive timing pulley 34 is mounted on the drive shaft 1 of the motor 2 such that the drive timing pulley 34 is secured to the drive shaft 1 by an attaching member 35 attached between the drive shaft 1 and the follower timing pulley 32. A timing belt 36 is arranged between the timing pulleys 32 and 34. Therefore, when the drive shaft 1 of the motor 2 is rotated and thus the drive timing pulley 34 secured to the drive shaft 1 is rotated, the rotational force is transmitted to the follower timing pulley 32 through the timing belt 36. As a result, the rotational disc 16 having the cylinder 15, to which the follower timing pulley 32 is attached, is rotated around the cylindrical fixed shaft 22.

The plural support rods 18, vertically secured to the rotational disc 16, and the disc-like support blocks 20, respectively attached to the upper ends of the support rods 18, form a holding means for horizontally holding a substrate required to be cleaned. The drive shaft 1, the motor 2, the rotational disc 16, the cylindrical fixed shaft 22, the bearings 29a and 29b, the timing pulleys 32 and 34 and the timing belt 36 form a rotating means for rotating the holding means.

A cylindrical high-frequency oscillation nozzle 41, serving as a first cleaning-fluid injection means, is disposed above the rotational disc 16 so as to be reciprocated as indicated by an arrow A in a range corresponding to the radius of the rotational disc 16. The cylindrical high-frequency oscillation nozzle 41, as shown in FIG. 2, has thread portions in the inner surface of the upper and lower portions thereof. Moreover, an annular engagement portion 44 horizontally projects over the inner surface of a lower portion of the cylinder body 43. A nozzle case 46 having a circular cleaning-fluid discharge port 45 in the lower end thereof is screwed to the lower portion of the cylinder body 43. A cleaning-fluid introduction pipe 47 is inserted into the cleaning-fluid introduction hole 42 of the cylinder body 43 so as to be secured to the cylinder body 43 by brazing. A disc-like oscillator 48 is disposed in the cylinder body 43 through an annular liquid-tight packing 49 attached to the annular engagement portion 44. An annular collar 50, also serving as a retainer and an earth, is disposed in contact with the outer surface of the disc-like oscillator 48. A metal retainer 51 having a thread portion on the outer surface thereof is brought into contact with the upper surface of the annular collar 50 by downwards screwing the same into the upper end of the cylinder body 43. A cable fitting member 54, having a through hole 52 in the central portion thereof and a thread portion 53 in the upper portion thereof, is brought into contact with the metal retainer 51 in the cylinder body 43 through the annular copper plate 55. An inverse-conical groove 56 is formed at the top end of the thread portion 53 of the cable fitting member 54. An inverse-conical ferrule 58 having a hole 57 formed in the central portion thereof made of, for example, fluorine resin, is received by an inverse-conical groove 56 formed at the top end of the thread portion 53 of the cable fitting member 54. A cap 60, having a hole 59 in the central portion thereof, is screwed to the thread portion 53 of the cable fitting member 54. The leading end of a coaxial cable 61 is allowed to pass through the hole 59 of the cap 60, the hole 57 of the ferrule 58 and the through hole 52 of the cable fitting member 54 so as to be inserted into the metal retainer 51. By downwards rotating the cap 60, the ferrule 58 is inserted into the inverse-conical groove 56. An wedge effect of the ferrule 58 fixes the coaxial cable 61 to the cable fitting member 54. A cable (a positive cable) 62 in the central portion of the coaxial cable 61 is connected to the upper surface of the disc-like oscillator 48 through the metal retainer 51 and the annular collar 50. A peripheral cable (earth cable) 63 of the coaxial cable 61 is connected to the annular copper plate 55 by soldering or the like. That is, the peripheral cable (earth cable) 63 is connected to the outer surface of the disc-like oscillator 48 through the metal retainer 51 and the annular collar 50 below the annular copper plate 55. The coaxial cable 61 is connected to a high-frequency oscillator (not shown).

The operation of the cleaning apparatus according to the first embodiment of the present invention will now be described.

A substrate, required to be cleaned, for example, a semiconductor wafer 64 is placed horizontally on the disc-like support blocks 20 attached to the four support rods 18 provided for the rotational disc 16. When the motor 2 is rotated to rotate the drive shaft 1 so as to rotate the drive timing pulley 34 secured to the drive shaft 1, the rotational force is transmitted to the follower timing pulley 32 through the timing belt 36. Thus, the rotational disc 16 having the cylinder 15, to which the follower timing pulley 32 is attached, is rotated around the cylindrical fixed shaft 22. As a result, the semiconductor wafer 64, placed on the disc-like support blocks 20 at the top ends of the four support rods 18 inserted and secured to the rotational disc 16, is rotated.

When cleaning fluid, for example, pure water, is supplied to the cleaning-fluid supply pipe (not shown) connected to the joint portion 24 of the cylindrical fixed shaft 22 in a state where the semiconductor wafer 64 is being rotated, pure water above is allowed to flow through the hollow portion 28 in the cylindrical fixed shaft 22 so as to be introduced into the cleaning-fluid passage 25 of the shower nozzle 27 communicated with the hollow portion 28. As a result, pure water above is upwards injected through the plural injection ports 26 in the upper portion of the shower nozzle 27. Since the shower nozzle 27 is located in the space surrounded by the four support rods 18 inserted and secured to the periphery of the rotational disc 16, pure water is injected from the shower nozzle 27 to the reverse side of the semiconductor wafer 64 which is placed and rotated on the disc-like support blocks 20 of the support rods 18. Cleaning fluid, for example, pure water, is introduced into the cleaning-fluid introduction pipe 47 of the cylindrical high-frequency oscillation nozzle 41 so as to supply pure water above into the cylinder body 43 through the cleaning-fluid introduction hole 42. When a high-frequency oscillator (not shown) is operated to apply high-frequency electric power to the disc-like oscillator 48 disposed above the cleaning-fluid introduction hole 42 of the cylinder body 43 through the coaxial cable 61, the disc-like oscillator 48 is oscillated with a required frequency. Therefore, pure water with the high-frequency acoustic waves is injected from the circular cleaning-fluid discharge port 45 of the nozzle case 46 attached to the lower portion of the cylinder body 43 to the surface of the semiconductor wafer 64 which is being rotated. Moreover, the high-frequency acoustic waves penetrate the semiconductor wafer 64. When the cylindrical high-frequency oscillation nozzle 41 is simultaneously reciprocated as indicated by an arrow A in a range corresponding to the radius of the rotational disc 16, that is, the radius of the semiconductor wafer 64, cleaning fluid with the high-frequency oscillator is injected through the circular cleaning-fluid discharge port 45 of the nozzle case 46 to the overall surface of the semiconductor wafer 64. Note that pure water injected from the nozzles 27 and 41 and used to clean the right and reverse sides of the semiconductor wafer 64 is accumulated in the processing chamber 12 before it is discharged to the outside through the discharge pipe 14.

As described above, the holding means and the rotating means horizontally hold and rotate the semiconductor wafer 64 and, in this state, pure water with the high-frequency acoustic waves, allowed to pass through the semiconductor wafer 64, is injected from the cylindrical high-frequency oscillation nozzle 41 disposed above the semiconductor wafer 64 to the surface of the semiconductor wafer 64. Moreover, the cylindrical high-frequency oscillation nozzle 41 is reciprocated as indicated by the arrow A in the range corresponding to the radius of the semiconductor wafer 64 so that the overall surface of the semiconductor wafer 64 is supplied with pure water with the high-frequency acoustic waves injected from the cylindrical high-frequency oscillation nozzle 41. As a result, particles on the surface of the semiconductor wafer 64 can be cleaned with pure water and re-adhesion of particles can be prevented. Thus, the semiconductor wafer 64 can precisely be cleaned.

When pure water with the high-frequency acoustic waves is injected form the cylindrical high-frequency oscillation nozzle 41 to the surface of the semiconductor wafer 64 to sweep the surface in the direction indicated by the arrow A and pure water is injected from the shower nozzle 27 disposed below the semiconductor wafer 64 to the reverse side of the semiconductor wafer 64, high-frequency acoustic waves emitted from the cylindrical high-frequency oscillation nozzle 41 pass through the semiconductor wafer 64 to also act on particles existing on the foregoing reverse side.

The liquid film of pure water above injected from the shower nozzle 27 cleans the particles. The high-frequency acoustic waves propagated to the liquid film are reflected by an air layer having a considerably different acoustic impedance. Thus, the high-frequency acoustic waves pass through the semiconductor wafer 64 while acting on the particles on the reverse side of the semiconductor wafer 64 to return to the right side of the semiconductor wafer 64. The high-frequency acoustic waves returned to the right side of the semiconductor wafer 64 are reflected by the interfaces between the liquid film on the surface of the semiconductor wafer 64 and the air layer. Then, the high-frequency acoustic waves are repeatedly reflected and thus decayed. Since the liquid film is formed by injecting pure water from the shower nozzle 29 to the reverse side of the semiconductor wafer 64 as described above, also the overall reverse side of the semiconductor wafer 64 can precisely be cleaned without a necessity of disposing a high-frequency nozzle below the semiconductor wafer 64, that is, at a position facing the reverse side of the same.

The following experiment was performed by using the cleaning apparatus according to the first embodiment and a fact that both of the right and reverse sides of a semiconductor wafer could precisely be cleaned was confirmed.

(Example)

Initially, the two polished sides of an 8-inch silicon wafer 64 were forcibly contaminated with silicon powder having a particle size of 0.2 $\mu$m or larger. The silicon wafer 64 was horizontally placed on the disc-like support blocks 20 attached to the four support rods 18 provided for the rotational disc 16. Then, the motor 2 was rotated to rotate the drive shaft 1 of the motor 2 so as to rotate the drive timing pulley 34 secured to the drive shaft 1. Thus, the rotational force of the motor 2 was transmitted to the follower timing pulley 32 though the timing belt 36 so that the rotational disc 16 having the cylinder 15, to which the follower timing pulley 32 was attached, was rotated around the cylindrical fixed shaft 22. As a result, the silicon wafer 64, placed on the disc-like support blocks 20 at the top ends of the four support rods 18 inserted and secured into the rotational disc 16, was rotated at speed of 1500 rpm. In a state where the silicon wafer 64 was being rotated, pure water was supplied into the cleaning-fluid supply pipe (not shown) connected to the joint portion 24 of the cylindrical fixed shaft 22. Pure water above was allowed to flow in the hollow portion 28 of the cylindrical fixed shaft 22 so as to be introduced into the cleaning-fluid passage 25 of the shower nozzle 27 connected to the hollow portion 28. Thus, pure water was injected to the reverse side of the silicon wafer 64, which was being rotated, at a flow rate of 2.4 litters/minute through the plural injection ports 26 in the upper portion of the shower nozzle 27. Moreover, pure water was introduced into the cleaning-fluid introduction pipe 47 of the cylindrical high-frequency oscillation nozzle 41 to supply pure water above into the cylinder body 43 through the cleaning-fluid introduction hole 42. Simultaneously, the high-frequency oscillator (not shown) was operated to supply high-frequency electric power to the disc-like oscillator 48 disposed above the cleaning-fluid introduction hole 42 of the cylinder body 43 through the coaxial cable 61. As a result, the disc-like oscillator 48 was oscillated at a frequency of 1.5 kHz so that high-frequency waves were emitted from the circular cleaning-fluid discharge port 45 of the nozzle case 46 attached to the lower portion of the cylinder body 43. Pure water with the high-frequency oscillator was injected to the surface of the rotating silicon wafer 64 with a flow rate of 0.8 litter/minute for 30 seconds. Simultaneously the cylindrical high-frequency oscillation nozzle 41 was reciprocated at speed of 3.0 m/minute in the range of the radius of the silicon wafer 64 so that the silicon wafer 64 was cleaned.

(Comparative Example)

A silicon wafer was cleaned by a method similarly to the Example except an elongated shower nozzle was employed in place of the high-frequency oscillation nozzle of the cleaning apparatus shown in FIG. 1 and pure water was injected from the shower nozzle to the rotating silicon wafer by a flow rate of 0.8 liter/minute.

The number of particles and removal ratio on the two sides of the silicon wafer cleaned by the methods according to the Example and Comparative Example were measured. Results are shown in Table 1.

TABLE 1

| | | UPPER VALUE: INITIAL PARTICLES INTERMEDIATE: PARTICLES AFTER SI SCRAPS WEE ALLOWED TO ADHERE LOWER VALUE: PARTICLES AFTER THE CLEANING PROCESS | | | | | REMOVAL PARTICLES AFTER THE CLEANING | REMOVAL RATIO |
|---|---|---|---|---|---|---|---|---|
| | WAFER | 0.2–0.3 | 0.3–0.4 | 0.4–2.0 | 2.0– | TOTAL | PROCESS | (%) |
| EXAMPLE | RIGHT SIDE | 32 5791 318 | 8 3939 88 | 5 1796 56 | 8 1762 57 | 53 13288 519 | 12769 | 96.1 |
| | REVERSE SIDE | 35 5134 1965 | 4 3158 543 | 2 1441 347 | 9 1547 370 | 50 11280 3125 | 8155 | 72.3 |
| COMPARATIVE EXAMPLE | RIGHT SIDE | 50 4505 4181 | 11 2757 2489 | 2 1239 928 | 2 1538 1156 | 65 10039 8754 | 1285 | 12.8 |
| | REVERSE SIDE | 51 4693 4280 | 15 2938 2364 | 7 1285 989 | 12 1795 1418 | 85 10711 9051 | 1660 | 15.5 |

As can be understood from Table 1, the cleaning apparatus according to the first embodiment of the present invention is able to satisfactorily remove particles on the two sides of a silicon wafer and, therefore, the silicon wafer can precisely be cleaned. If the particle removal ratio on the reverse side of the silicon wafer is about 70%, a semiconductor device free from contamination due to particles on the reverse side and having excellent characteristics can be manufactured from the above-mentioned wafer.

After the silicon wafer 64 has been cleaned, injection of pure water from the shower nozzle 27 and that of pure water with the high-frequency acoustic waves from the cylindrical high-frequency oscillation nozzle 41 are interrupted, and then the rotational speed of the motor 2 for rotating the drive shaft 1 is raised to rotate the rotational disc 16 at high speed, for example, 3000 rpm. Thus, silicon wafers 64, each of which is placed on the disc-like support blocks 20 of the support rods 18 of the rotational disc 16, can successively spin-dried.

(SECOND EMBODIMENT)

Figure 3:
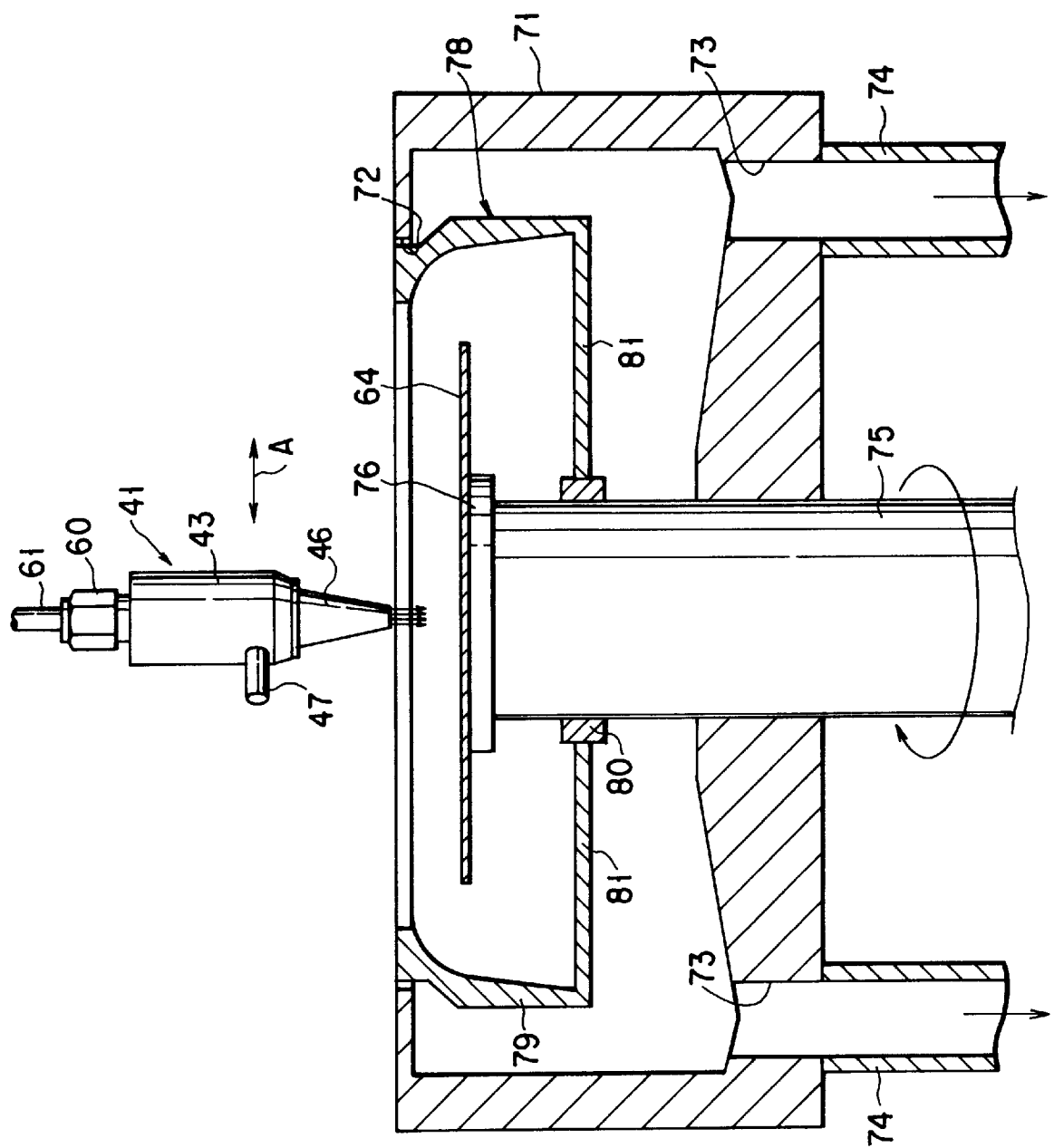
FIG. 3 is a cross sectional view showing a cleaning apparatus according to a second embodiment of the present invention.
Figure 4:
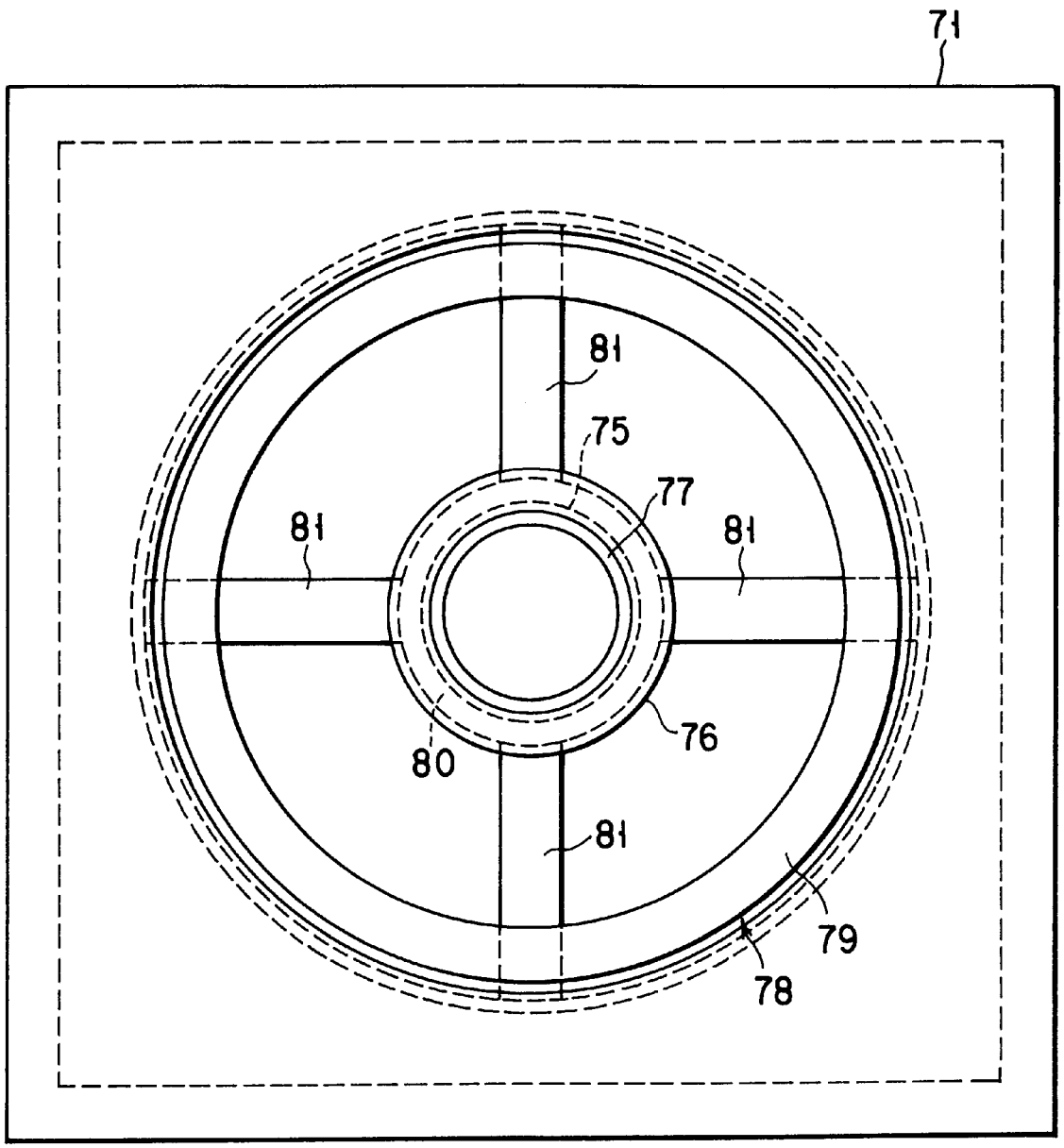
FIG. 4 is a top view of FIG. 3 showing the cleaning apparatus from which a cylindrical high-frequency oscillation nozzle is removed.

FIG. 3 is a cross sectional view showing a cleaning apparatus according to a second embodiment of the present invention. FIG. 4 is a top view of FIG. 3 showing the cleaning apparatus from which the cylindrical high-frequency oscillation nozzle is removed.

A cleaning-fluid receiving chamber 71 in the form of a rectangular pipe having a bottom has a circular opening 72 in the top surface thereof and two small holes 73 in the bottom portion thereof. Two suction pipes 74 are connected to the bottom portion of the cleaning-fluid receiving chamber 71 such that the suction pipes 74 are communicated with the small holes 73. A rotational shaft 75 having a suction hole (not shown) formed in the axial direction thereof penetrates the central portion of the bottom portion of the cleaning-fluid receiving chamber 71 and then borne by a bearing (not shown). Note that the suction hole of the rotational shaft 75 is communicated with a suction unit (not shown). A disc-like holding frame 76 for vacuum-chucking a substrate required to be cleaned is attached to the top end of the rotational shaft 75. The upper surface of the disc-like holding frame 76 has an annular groove 77 communicated with the suction hole formed in the rotational shaft 75.

A shielding member 78 is rotatively disposed in the cleaning-fluid receiving chamber 71. The shielding member 78 consists of a cylindrical side wall 79 disposed such that the top end of the shielding member 78 forms one plane together with the cleaning-fluid receiving chamber 71; a connection ring 80 attached around the rotational shaft 75; and four support plates 81 radially connected to the connection ring 80 to extend in the horizontal direction such that each end of the support plates 81 is connected to the connection ring 80 and other ends of the support plates 81 are integrally formed with the lower end of the cylindrical side wall 79.

A cylindrical high-frequency oscillation nozzle 41 is disposed above the cleaning-fluid receiving chamber 71 so as to be reciprocated in the radial direction (as indicated by an arrow) of the substrate required to be cleaned and held by the disc-like holding frame 76. The cylindrical high-frequency oscillation nozzle 41 has a structure similar to that according to the first embodiment shown in FIG. 2.

The operation of the cleaning apparatus according to the second embodiment will now be described.

The substrate required to be cleaned, for example, a semiconductor wafer 64, is placed on the disc-like holding frame 76, and then a suction unit (not shown) is operated to suck the annular groove 77 formed in the disc-like holding frame 76. Thus, the semiconductor wafer 64 is vacuum-chucked on the disc-like holding frame 76. When the rotational shaft 75 is rotated by a motor (not shown) in the above-mentioned state, the semiconductor wafer 64 vacuum-chucked on the disc-like holding frame 76 and the shielding member 78 are integrally rotated, for example, clockwise. In the foregoing state where the semiconductor wafer 64 is being rotated, cleaning fluid, for example, pure water is introduced into the cleaning-fluid introduction pipe 47 of the cylindrical high-frequency oscillation nozzle 41 shown in FIG. 2. Then, pure water above is supplied into the cylinder body 43 through the cleaning-fluid introduction hole 42. When high-frequency electric power is supplied from a high-frequency oscillator (not shown) to the disc-like oscillator 48 disposed above the cleaning-fluid introduction hole 42 of the cylinder body 43 through the coaxial cable 61, the disc-like oscillator 48 is oscillated at a required frequency. Therefore, pure water with high-frequency acoustic waves is injected from the circular cleaning-fluid discharge port 45 of the nozzle case 46 attached to the lower portion of the cylinder body 43. When the cylindrical high-frequency oscillation nozzle 41 is reciprocated as indicated by the arrow A in the range corresponding to the radius of the semiconductor wafer 64, cleaning fluid with high-frequency acoustic waves is injected from the circular cleaning-fluid discharge port 45 of the nozzle case 46 to the overall surface of the semiconductor wafer 64.

When pure water is injected from the cylindrical high-frequency oscillation nozzle 41 to the semiconductor wafer 64, pure water is splashed on the surface of the semiconductor wafer 64. In particular, pure water splashed in a horizontal direction, for example, in a direction of the tangent of the locus of rotation of the semiconductor wafer 64 collides with the inner surface of the cylindrical side wall 79 of the shielding member 78 around the semiconductor wafer 64. When pure water collides with the inner surface of the cylindrical side wall 79 of the shielding member 78 as described above, the shielding member 78 is integrally rotated together with the disc-like holding frame 76 holding the semiconductor wafer 64 to cause splashed pure water, which flows toward the inner surface of the cylindrical side wall 79, to flow along the surface of the shielding member 78 so that collision oscillator pure water is moderated. As a result, splash of pure water used in cleaning the semiconductor wafer 64 cannot return to the surface of the semiconductor wafer 64. Note that pure water used to clean the semiconductor wafer 64 and allowed to flow along the inner surface of the cylindrical side wall 79 is allowed to flow between the plural support plates 81 of the shielding member 78, followed by being dropped onto the bottom portion of the cleaning-fluid receiving chamber 71. Then, pure water above flows through the small holes 73 and the suction pipes 74, and then discharged to the outside of the cleaning apparatus.

Therefore, the structure, in which the disc-like holding frame 76 and the shielding member 78 are integrally rotated, prevents re-adhesion of pure water used to clean the semiconductor wafer 64 to the surface of the semiconductor wafer 64 and contamination of the semiconductor wafer 64 even if the distance from the semiconductor wafer 64 to the shielding member 78 is shortened. As a result, a small size cleaning apparatus capable of cleaning a subject with significant purity can be realized.

(THIRD EMBODIMENT)

Figure 5:
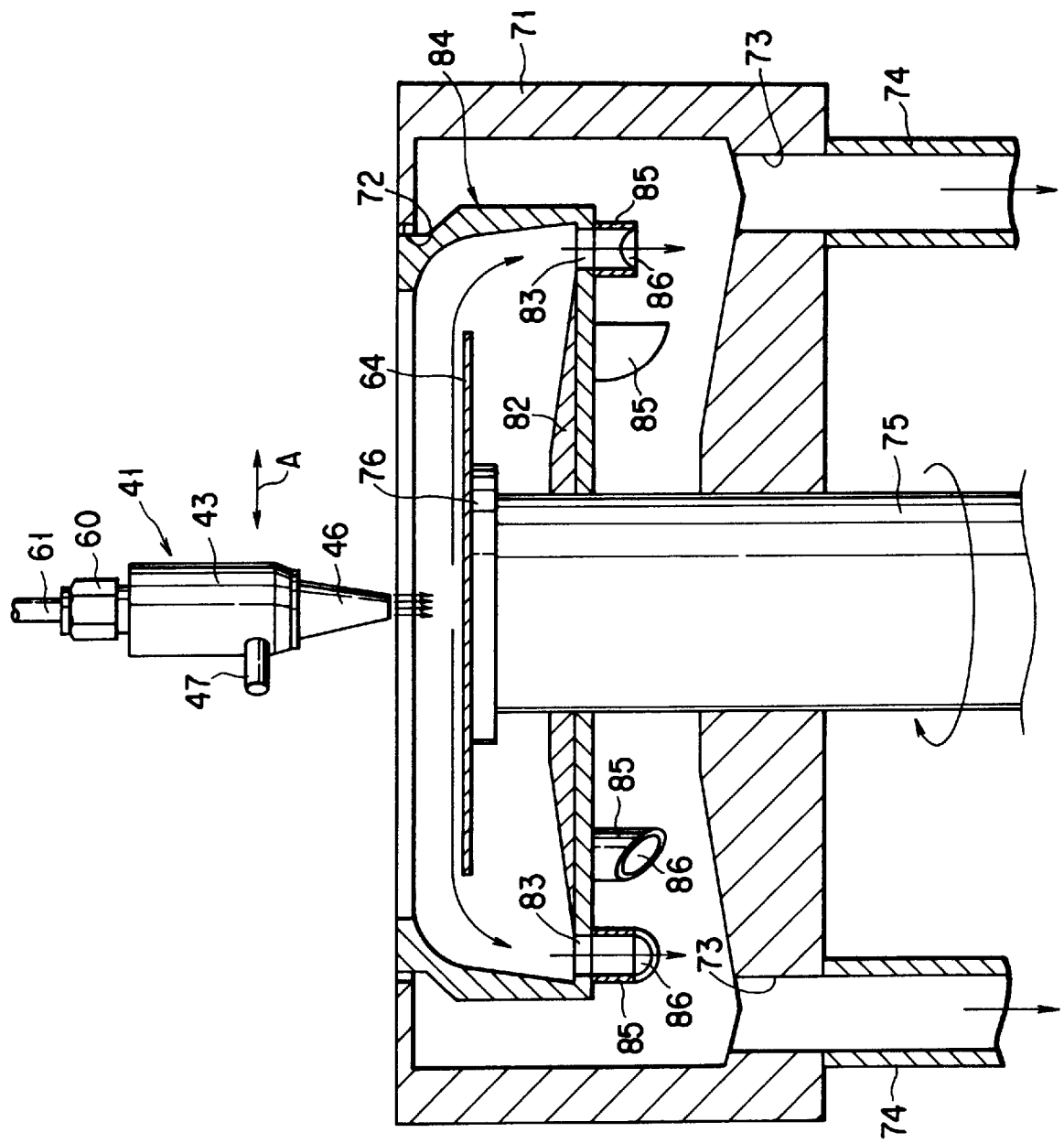
FIG. 5 is a cross sectional view showing a cleaning apparatus according to a third embodiment of the present invention.

FIG. 5 is a cross sectional view showing a cleaning apparatus according to a third embodiment. Similar elements to those shown in FIG. 3 are given the same reference numerals and the similar elements are omitted from description.

A shielding member 84 in the form of a cylinder having a bottom is disposed in the cleaning-fluid receiving chamber 71 in such a manner that the rotational shaft 75 is inserted into the central portion of the cleaning-fluid receiving chamber 71. The shielding member 84 has a flat guide plate 82 in the form of a truncated cone and applied to the inner surface of the bottom portion thereof. Moreover, eight openings 83 are formed in the periphery of the bottom portion of the shielding member 84 at the same intervals. The shielding member 84 is disposed in such a manner that the top end of the shielding member 84, in the opening 72 of the cleaning-fluid receiving chamber 71, forms one plane together with the upper surface of the cleaning-fluid receiving chamber 71. For example, eight differential-pressure pipes 85, each having a shape obtained by diagonally cutting the lower end of a cylindrical pipe, are connected to the bottom surface of the shielding member 84 in such a manner that the differential-pressure pipes 85 are communicated with the openings 83. Each of the differential-pressure pipes 85 is disposed in such a manner that an opening 86 formed in the lower end of each of the differential-pressure pipes 85 faces a direction of the tangent of the shielding member 84 in the form of the cylinder having the bottom and the opening 86 faces opposite to the direction of the rotation of the shielding member 84. The openings 86 and the differential-pressure pipes 85 form different-pressure generating member.

The operation of the cleaning apparatus according to the third embodiment will now be described.

The substrate required to be cleaned, for example, a semiconductor wafer 64, is placed on the disc-like holding frame 76, and then a suction unit (not shown) is operated to suck an annular groove (not shown) formed in the disc-like holding frame 76. Thus, the semiconductor wafer 64 is vacuum-chucked on the disc-like holding frame 76. When the rotational shaft 75 is rotated by a motor (not shown) in the above-mentioned state, the semiconductor wafer 64 vacuum-chucked on the disc-like holding frame 76 and the shielding member 84 are integrally rotated, for example, clockwise. In the foregoing state where the semiconductor wafer 64 is being rotated, cleaning fluid, for example, pure water is introduced into the cleaning-fluid introduction pipe 47 of the cylindrical high-frequency oscillation nozzle 41 shown in FIG. 2. Then, pure water above is supplied into the cylinder body 43 through the cleaning-fluid introduction hole 42. When high-frequency electric power is supplied from a high-frequency oscillator (not shown) to the disc-like oscillator 48 disposed above the cleaning-fluid introduction hole 42 of the cylinder body 43 through the coaxial cable 61, the disc-like oscillator 48 is oscillated at a required frequency. Therefore, pure water with high-frequency acoustic waves is injected from the circular cleaning-fluid discharge port 45 of the nozzle case 46 attached to the lower portion of the cylinder body 43. When the cylindrical high-frequency oscillation nozzle 41 is reciprocated as indicated by the arrow A in the range corresponding to the radius of the semiconductor wafer 64, cleaning fluid with high-frequency acoustic waves is injected from the circular cleaning-fluid discharge port 45 of the nozzle case 46 to the overall surface of the semiconductor wafer 64.

The shielding member 84 for closing the space surrounding the disc-like holding frame 76 is provided with the different-pressure generating member consisting of the plural openings 83 formed in the periphery of the shielding member 84 at the same intervals and the differential-pressure pipes 85 respectively communicated with the openings 83 and having, at the lower ends, the openings 86 facing opposite to the direction of the rotation of the shielding member 84. Therefore, when the disc-like holding frame 76 and the shielding member 84 in the form of the cylinder having the bottom are integrally rotated by the rotational shaft 75, air pressure adjacent to each of the differential-pressure pipes 85 disposed in the bottom portion of the shielding member 84 is lowered. Thus, air in the shielding member 84 in the form of the cylinder having the bottom is sucked and discharged through the openings 86 at the lower end of each of the differential-pressure pipes 85. Therefore, strong airflows are generated from the center of the rotating semiconductor wafer 64 toward the periphery of the semiconductor wafer 64, as indicated by arrows shown in FIG. 5. As a result, pure water injected to the semiconductor wafer 64 and splashed by the surface of the semiconductor wafer 64 does not substantially reach the inner surface of the cylindrical side wall of the shielding member 84. Pure water is, by the airflows generated by the different-pressure generating member and flowing from the central portion of the surface of the semiconductor wafer 64 toward the periphery of the semiconductor wafer 64, forcibly discharged to the plural openings 83 formed in the bottom portion of the shielding member 84.

Even if a portion of pure water, splashed by the surface of the semiconductor wafer 64 after pure water above has been injected from the cylindrical high-frequency oscillation nozzle 41 to the semiconductor wafer 64, reaches the inner surface of the cylindrical side wall of the shielding member 84, the shielding member 84 is integrally rotated together with the disc-like holding frame 76 for holding the semiconductor wafer 64 to cause splashed pure water flying toward the inner surface of the cylindrical side wall to flow along the surface of the shielding member 84 so as to moderate collision of pure water. Therefore, return of pure water used to clean the semiconductor wafer 64 from the inner surface of the cylindrical side wall of the shielding member 84 to the surface of the semiconductor wafer 64 can be prevented.

Pure water used to clean the semiconductor wafer 64 and discharged through the plural openings 83 in the bottom portion of the shielding member 84 and the differential-pressure pipes 85 and pure water used to clean the semiconductor wafer 64 allowed to flow along the inner surface of the cylindrical side wall of the shielding member 84 are dropped to the bottom portion of the cleaning-fluid receiving chamber 71. Then, pure water above is allowed to pass through the small holes 73 and the suction pipes 74 so as to be discharged to the outside of the cleaning apparatus.

Therefore, the structure, in which the disc-like holding frame 76 and the shielding member 84 are integrally rotated and in which the different-pressure generating member is provided for the shielding member 84, prevents re-adhesion of pure water used to clean the semiconductor wafer 64 to the surface of the semiconductor wafer 64 and contamination of the semiconductor wafer 64 even if the distance from the semiconductor wafer 64 to the shielding member 84 is shortened. As a result, a small size cleaning apparatus capable of cleaning a subject with significant purity can be realized.

(FOURTH EMBODIMENT)

Figure 6:
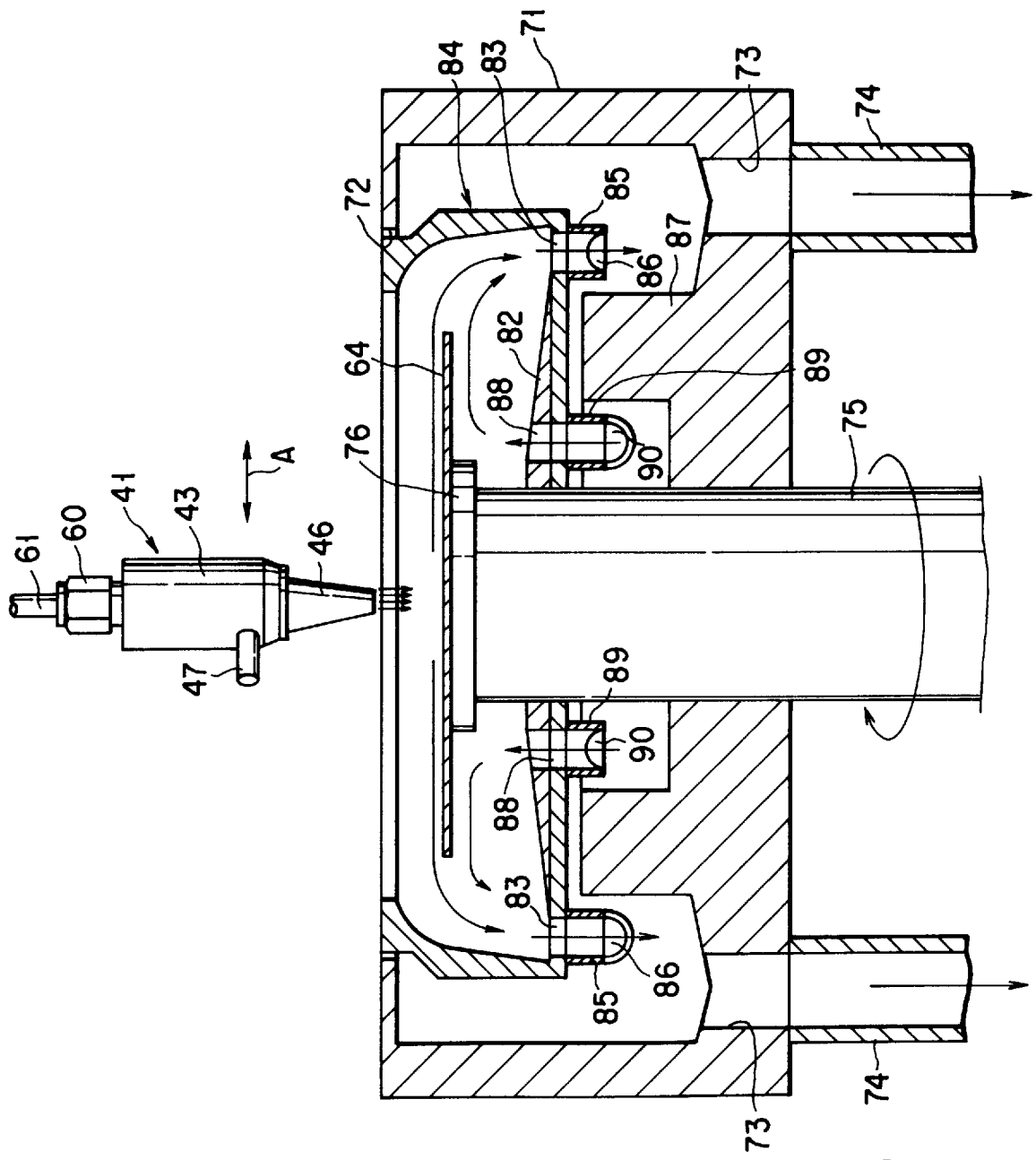
FIG. 6 is a cross sectional view showing a cleaning apparatus according to a fourth embodiment of the present invention.

FIG. 6 is a cross sectional view showing a cleaning apparatus according to a fourth embodiment. Similar elements to those according to the third embodiment shown in FIG. 5 are given the same reference numerals and the similar elements are omitted from illustration.

In the bottom portion of the cleaning-fluid receiving chamber 71 in the form of the rectangular pipe having the bottom, an annular projection portion 87 is formed adjacent to the bottom surface portion of the shielding member 84 in the form of the cylinder having the bottom positioned on the inside of the plural differential-pressure pipes 85 (the first different pressure pipes) of the different-pressure generating member (the first different-pressure generating member). The bottom portion of the shielding member 84 positioned between the rotational shaft 75 and the annular projection portion 87 has, for example, four openings 88 formed at the same intervals. For example, four second differential-pressure pipes 89, each having a shape formed by diagonally cutting the lower end of a cylindrical pipe, are connected to the bottom surface of the shielding member 84 in such a manner that the second differential-pressure pipes 89 are communicated with the annular projection portion 87. The second differential-pressure pipes 89 are disposed in such a manner that openings 90 of the second differential-pressure pipes 89 face a direction of the tangent of the shielding member 84 in the form of the cylinder having the bottom and face the direction of the rotation of the shielding member 84. The openings 88 and the second differential-pressure pipes 89 form the second different-pressure generating member.

The operation of the fourth embodiment will now be described.

A substrate required to be cleaned, for example, a semiconductor wafer 64, is placed on the disc-like holding frame 76, and then a suction unit (not shown) is operated to suck an annular groove (not shown) formed in the disc-like holding frame 76. Thus, the semiconductor wafer 64 is vacuum-chucked on the disc-like holding frame 76. When the rotational shaft 75 is rotated by a motor (not shown) in the above-mentioned state, the semiconductor wafer 64 vacuum-chucked on the disc-like holding frame 76 and the shielding member 84 are integrally rotated, for example, clockwise. In the foregoing state where the semiconductor wafer 64 is being rotated, cleaning fluid, for example, pure water is introduced into the cleaning-fluid introduction pipe 47 of the cylindrical high-frequency oscillation nozzle 41 shown in FIG. 2. Then, pure water above is supplied into the cylinder body 43 through the cleaning-fluid introduction hole 42. When high-frequency electric power is supplied from a high-frequency oscillator (not shown) to the disc-like oscillator 48 disposed above the cleaning-fluid introduction hole 42 of the cylinder body 43 through the coaxial cable 61, the disc-like oscillator 48 is oscillated at a required frequency. Therefore, pure water with high-frequency acoustic waves is injected from the circular cleaning-fluid discharge port 45 of the nozzle case 46 attached to the lower portion of the cylinder body 43. When the cylindrical high-frequency oscillation nozzle 41 is simultaneously reciprocated as indicated by the arrow A in the range corresponding to the radius of the semiconductor wafer 64, cleaning fluid with high-frequency acoustic waves is injected from the circular cleaning-fluid discharge port 45 of the nozzle case 46 to the overall surface of the semiconductor wafer 64.

The shielding member 84 for closing the space surrounding the disc-like holding frame 76 is provided with the first different-pressure generating member consisting of the plural openings 83 formed in the periphery of the shielding member 84 at the same intervals and the first differential-pressure pipes 85 respectively communicated with the openings 83 and having, at the lower ends, the openings 86 facing opposite to the direction of the rotation of the shielding member 84. Therefore, when the disc-like holding frame 76 and the shielding member 84 in the form of the cylinder having the bottom are integrally rotated by the rotational shaft 75, air pressure adjacent to each of the first differential-pressure pipes 85 disposed in the bottom portion of the shielding member 84 is lowered. Thus, air in the shielding member 84 in the form of the cylinder having the bottom is sucked and discharged through the openings 86 at the lower end of each of the first differential-pressure pipes 85. Therefore, strong airflows are generated from the center of the rotating semiconductor wafer 64 toward the periphery of the semiconductor wafer 64, as indicated by arrows shown in FIG. 6.

Moreover, a second differential pressure generating member is disposed adjacent to the central portion of the bottom portion of the shielding member 84 surrounded by the rotational shaft 75 and the annular projection portion 87, the second differential pressure generating member consisting of the plural openings 88 formed at the same intervals and pressure pipes 89 respectively communicated with the openings 88 and having openings 90 formed at the lower ends thereof to be faced the direction of the rotation of the shielding member 84. Thus, when the disc-like holding frame 76 and the shielding member 84 are integrally rotated by the rotational shaft 75, the air pressure adjacent to the openings 90 formed at the lower ends of the second differential-pressure pipes 89 of the second different-pressure generating member disposed in the bottom portion of the shielding member 84 is raised. That is, the air pressure is raised to be higher than the air pressure in the shielding member 84 so that air in the space defined by the rotational shaft 75, the annular projection portion 87 and the bottom portion of the shielding member 84 is introduced into the shielding member 84 through the second differential-pressure pipes 89 and the openings 88. As a result, strong airflows are generated from a position adjacent to the reverse side of the rotating semiconductor wafer 64 to the plural openings 83 in the bottom portion of the shielding member 84 through the periphery of the semiconductor wafer 64, as indicated by arrows shown in FIG. 6.

As a result, pure water injected to the semiconductor wafer 64 and splashed by the surface of the semiconductor wafer 64 does not substantially reach the inner surface of the cylindrical side wall of the shielding member 84. Pure water is forcibly discharged to the plural openings 83 of the first different-pressure generating member with the airflows from the central portion of the surface of the semiconductor wafer 64. Simultaneously, introduction of splashed pure water by the airflow from a position adjacent to the central portion of the reverse side of the semiconductor wafer 64 to the periphery of the same by the second different-pressure generating member to the reverse side can be prevented.

If a portion of pure water splashed by the surface of the semiconductor wafer 64 reaches the inner surface of the cylindrical side wall of the shielding member 84 after pure water has been injected from the cylindrical high-frequency oscillation nozzle 41 to the semiconductor wafer 64, the structure, in which the shielding member 84 is integrally rotated together with the disc-like holding frame 76 for holding the semiconductor wafer 64, causes pure water flowing toward the inner surface of the cylindrical side surface to flow along the shielding member 84, moderates collision of pure water. Therefore, return of the pure water used to clean the semiconductor wafer 64 from the inner surface of the cylindrical side wall of the shielding member 84 to the surface of the semiconductor wafer 64 can be prevented.

Pure water used to clean the semiconductor wafer 64 and discharged through the plural openings 83 and the first differential-pressure pipes 85 of the first different-pressure generating member provided for the shielding member 84 and pure water used to clean the semiconductor wafer 64 and allowed to flow along the inner surface of the cylindrical side wall of the shielding member 84 are dropped to the bottom portion of the cleaning-fluid receiving chamber 71. Then, pure water is allowed to flow in the small holes 73 and the suction pipes 74 and then discharged to the outside of the cleaning apparatus.

Therefore, the integral rotation of the disc-like holding frame 76 and the shielding member 84 and provision of the first and second different-pressure generating members for the shielding member 84 further reliably prevent re-adhesion of pure water used to clean the semiconductor wafer 64 to the surface of the semiconductor wafer 64 and contamination of the semiconductor wafer 64. Therefore, a small cleaning apparatus capable of cleaning the semiconductor wafer 64 with significant purity can be realized.

(FIFTH EMBODIMENT)

Figure 7:
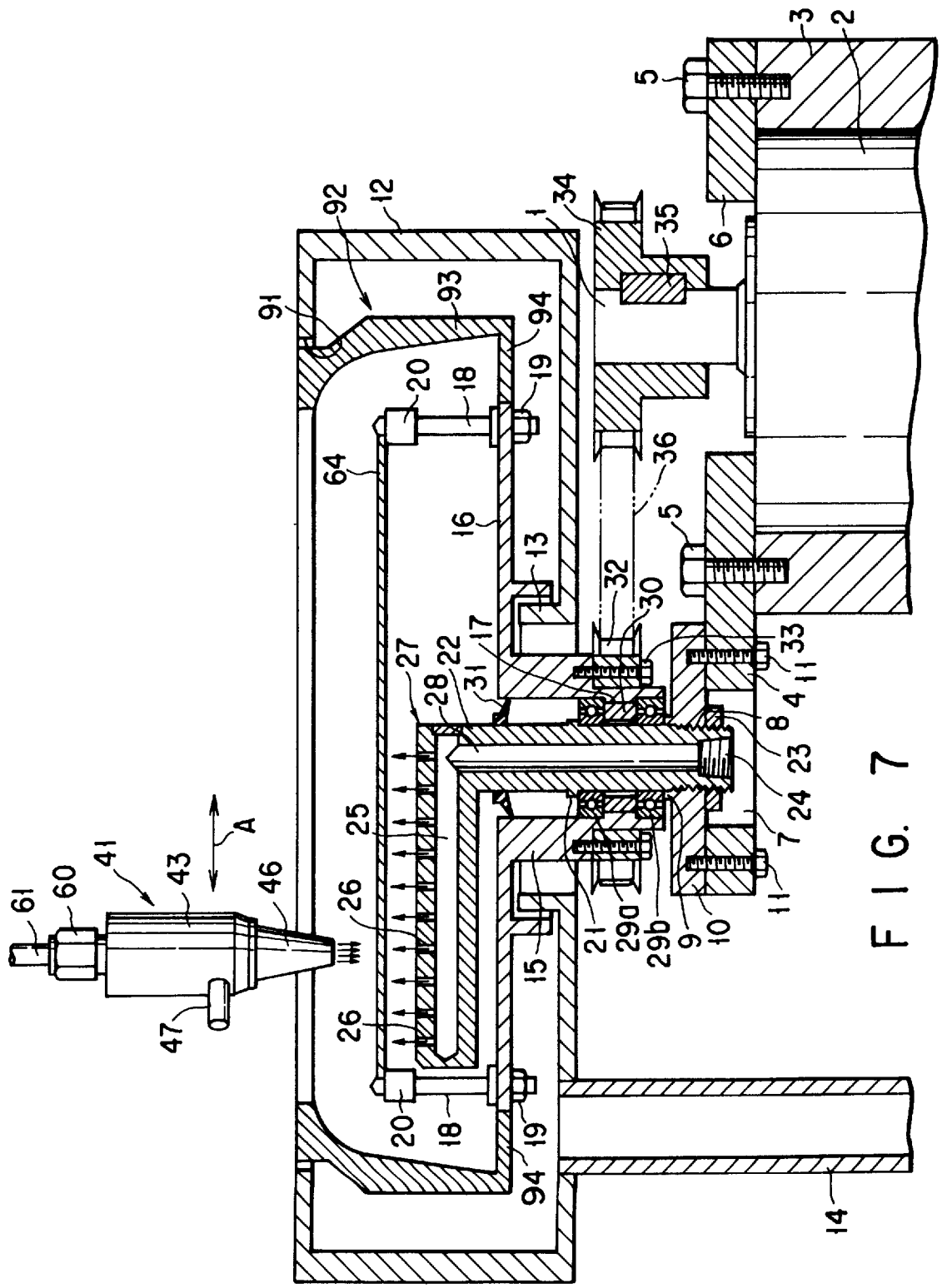
FIG. 7 is a cross sectional view showing the cleaning apparatus according to the fifth embodiment of the present invention.

FIG. 7 is a cross sectional view showing a cleaning apparatus according to a fifth embodiment. Similar elements to those according to the first embodiment and shown in FIG. 1 are given the same reference numeral and the similar elements are omitted from illustration.

The processing chamber 12, in the form of the rectangular pipe having the bottom and provided with a circular opening 91 in the upper surface thereof, is supported and secured by a frame (not shown) in such a manner that the cylindrical portion 13 of the processing chamber 12 is concentrically located to the hole 8 of the disc-like plate 10. A shielding member 92 is rotatively disposed in the processing chamber 12. The shielding member 92 consists of a cylindrical side wall 93 disposed in such a manner that the top end of the cylindrical side wall 93 forms one place together with the top surface of the processing chamber 12; and, for example, four support plates 94 are radially connected to the rotational disc 16 in such a manner that ends of the support plates 94 face the horizontal direction and other ends integrally are attached to the lower end of the cylindrical side wall 93.

In the cleaning apparatus according to the fifth embodiment, the substrate required to be cleaned, for example, the semiconductor wafer 64 is horizontally placed on the disc-like support blocks 20 attached to the four support rods 18 provided for the rotational disc 16. The motor 2 is rotated to rotate the drive shaft 1 of the motor 2 so as to rotate the drive timing pulley 34 secured to the drive shaft 1. Thus, the rotational force of the motor 2 is transmitted to the follower timing pulley 32 through the timing belt 36. Therefore, the rotational disc 16 having the cylinder 15 to which the follower timing pulley 32 is attached is rotated around the cylindrical fixed shaft 22. As a result, the semiconductor wafer 64 placed on the disc-like support blocks 20 at the top ends of the four support rods 18 inserted and secured to the rotational disc 16 is rotated. While horizontally holding and rotating the semiconductor wafer 64 by the above-mentioned holding means and the rotating means, pure water with high-frequency acoustic waves capable of penetrating the semiconductor wafer 64 is injected from the cylindrical high-frequency oscillation nozzle 41 disposed above the semiconductor wafer 64 to the surface of the semiconductor wafer 64. Simultaneously, pure water is injected from the shower nozzle 27 disposed below the semiconductor wafer 64 to the reverse side of the semiconductor wafer 64. Thus, both of the two sides of the semiconductor wafer 64 can precisely be cleaned similarly to the cleaning apparatus according to the first embodiment.

By rotating the rotational disc 16 to integrally rotate the support rods 18 connected to the rotational disc 16, the disc-like support blocks 20 (the holding means) attached to the support rods 18 and the shielding member 92 prevent re-adhesion of pure water used to clean the semiconductor wafer 64 to the surface of the semiconductor wafer 64 and contamination of the semiconductor wafer 64 similarly to the cleaning apparatus according to the second embodiment even if the distance from the semiconductor wafer 64 to the shielding member 92 is shortened. Therefore, a small cleaning apparatus capable of cleaning the semiconductor wafer 64 with significant purity can be realized.

The cleaning apparatus according to the first embodiment may be structured such that the function for preventing splash of cleaning fluid similar to that of the cleaning apparatus according to the third and fourth embodiments is provided for the inside portion of the processing chamber 12. Specifically, the cleaning apparatus according to the first embodiment and shown in FIG. 1 may be structured such that the processing chamber 12 has a shape similar to that of the cleaning-fluid receiving chamber 71 in the form of a rectangular tube having the bottom according to the third embodiment and shown in FIG. 5 such that the circular opening 72 is formed in the top surface thereof and two small holes 73 in the bottom portion thereof. Moreover, the shielding member 84 having the different-pressure generating member shown in FIG. 5 is disposed in the cleaning-fluid receiving chamber 71 so as to be integrally rotated together with the rotational disc 16 shown in FIG. 1. Moreover, the cleaning apparatus according to the first embodiment and shown in FIG. 1 may be structured such that the processing chamber 12 has a shape similar to that of the cleaning-fluid receiving chamber 71 in the form of a rectangular tube having the bottom according to the fourth embodiment and shown in FIG. 6 such that the circular opening 72 is formed in the top surface thereof and two small holes 73 are in the bottom portion thereof. Moreover, the shielding member 84 having the first and second different-pressure generating members shown in FIG. 6 is disposed in the cleaning-fluid receiving chamber 71 so as to be integrally rotated together with the rotational disc 16 shown in FIG. 1.

Although the first to fifth embodiments have the structure such that the cylindrical high-frequency oscillation nozzle is employed which is arranged to move in the range of the radius of the substrate (for example, the silicon wafer) required to be cleaned, the nozzle according to the present invention is not limited to this. For example, a bar-type high-frequency oscillation nozzle having a rectangular body provided with an elongated cleaning-fluid discharge port may be employed in place of the cylindrical high-frequency oscillation nozzle to obtain a similar effect.

(SIXTH EMBODIMENT)

Figure 8:
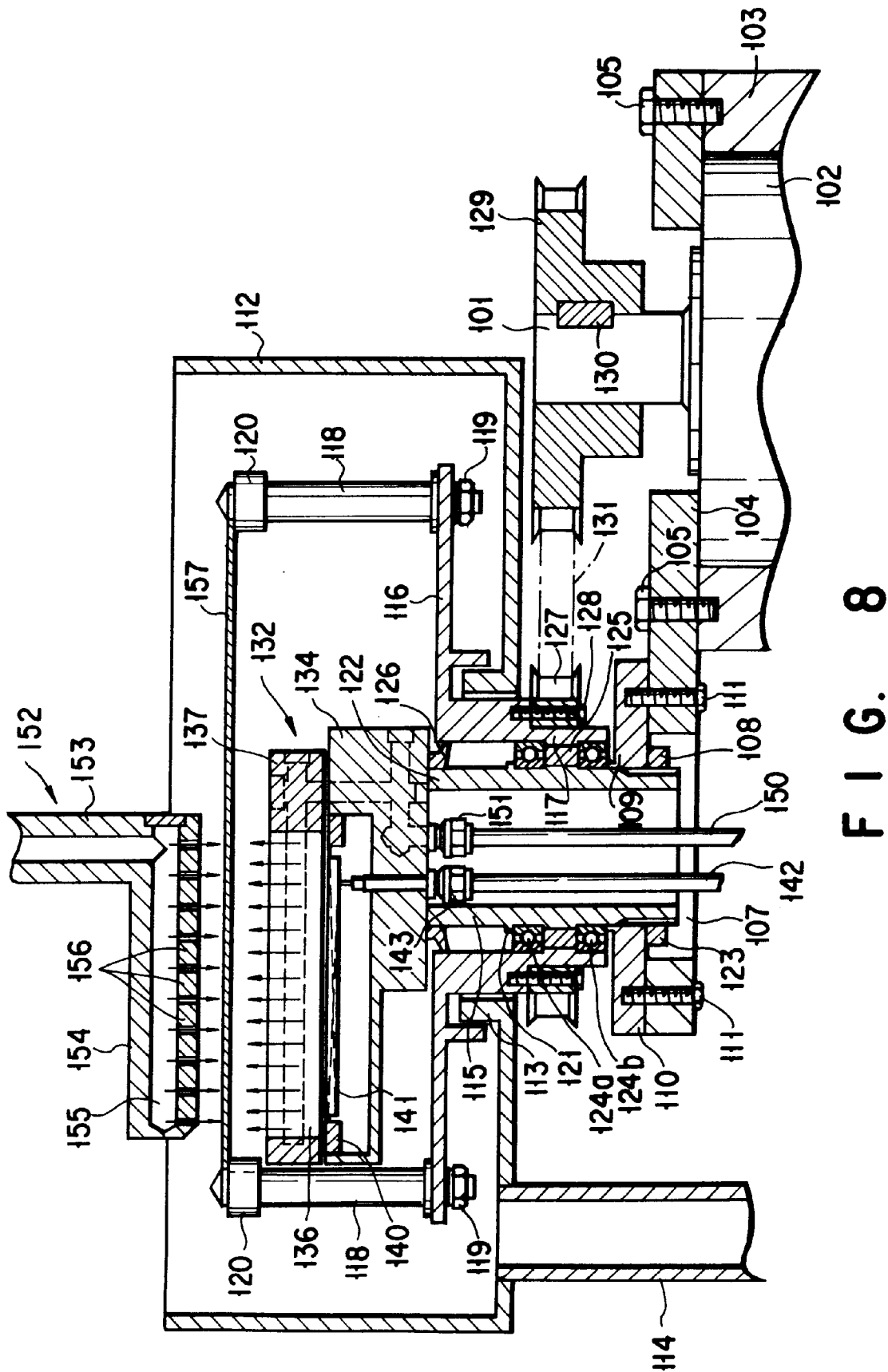
FIG. 8 is a cross sectional view showing a cleaning apparatus according to a sixth embodiment of the present invention.
Figure 9:
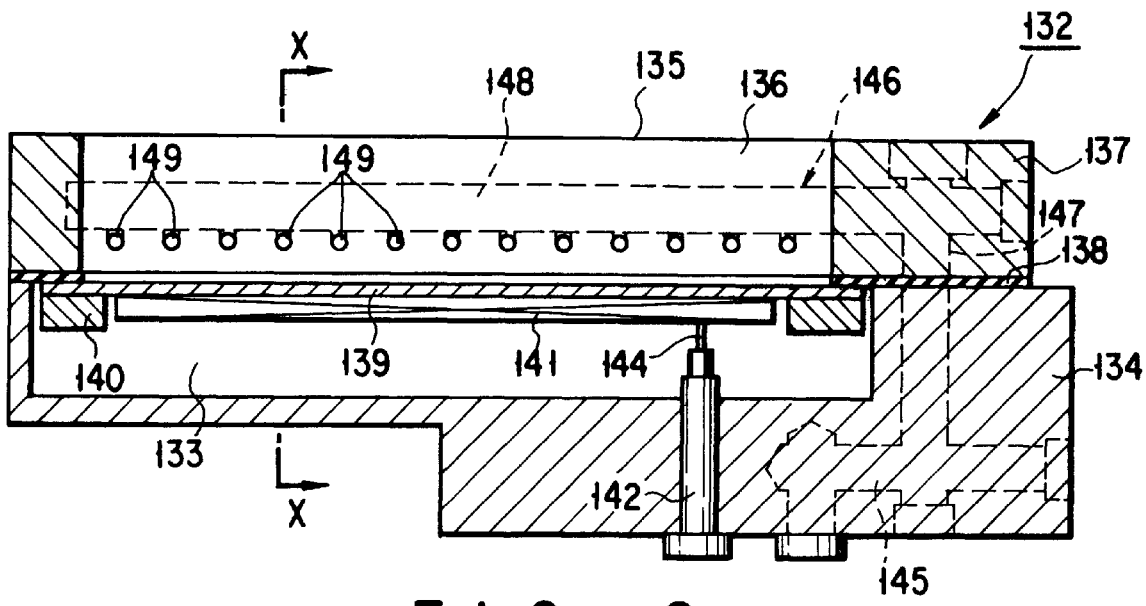
FIG. 9 is a cross sectional view showing a bar-type high-frequency oscillation nozzle serving as a first cleaning-fluid injection means which is included in the cleaning apparatus shown in FIG. 8.
Figure 10:
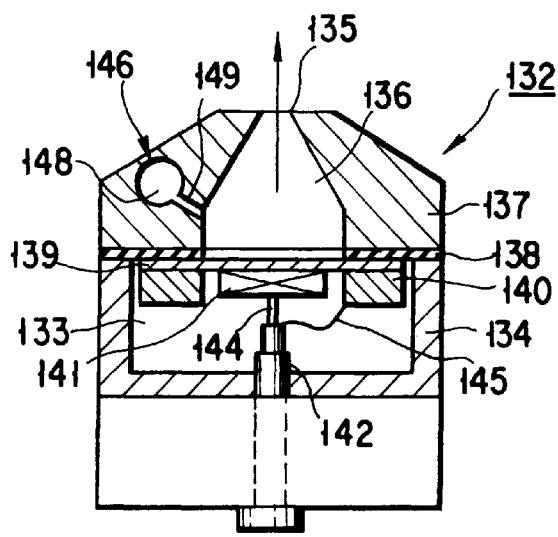
FIG. 10 is a cross sectional view taken along line X—X shown in FIG. 9.

FIG. 8 is a cross sectional view of a single-transfer-type cleaning apparatus according to a sixth embodiment of the present invention. FIG. 9 is a cross sectional view showing a bar-type high-frequency oscillation nozzle serving as a first cleaning-fluid injection means for use in the cleaning apparatus shown in FIG. 8. FIG. 10 is a cross sectional view taken along line X—X shown in FIG. 9.

A motor 102 having a drive shaft 101 extending in the vertical direction is accommodated in a cylindrical support member 103. A support plate 104 is secured to the upper surface of the cylindrical support member 103 with a plurality of screws 105. The support plate 104 has holes 106 and 107 respectively formed at positions corresponding to the drive shaft 101 and a portion extending from the cylindrical support member 103 to the left. A disc-like plate 110 having a hole 108 in the central portion thereof and an annular projection portion 109 formed around the hole 108 is secured to the upper surface of the support plate 104 by a plurality of screws 111 inserted from the lower surface of the support plate 104 toward the plate 110.

A processing chamber 112 is disposed above the disc-like plate 110. The processing chamber 112 has a cylindrical portion 113 in the form of a cylindrical shape having a bottom and upwards projecting over the central portion of the bottom portion of the processing chamber 112. A discharge pipe 114 is connected to the bottom portion adjacent to the left side wall of the processing chamber 112. The processing chamber 112 is, by a frame (not shown), supported and secured in such a manner that the cylindrical portion 113 is disposed concentrically to the hole 108 of the disc-like plate 110.

A rotational disc 116, having a cylinder 115 downwards projecting in the central portion thereof, is disposed horizontally in the processing chamber 112. The cylinder 115 concentrically penetrates the cylindrical portion 113 of the processing chamber 112 to extend to the outside of the processing chamber 112. An annular engagement portion 117 horizontally projects over the inner surface of a lower portion of the cylinder 115. A plurality of, for example, four, support rods 118 having threads in the upper and lower portions thereof are inserted into the peripheral portion of the rotational disc 116 at the same angular degree (90°) to project vertically. By setting nuts 119 to the thread portions in the lower portions of the support rods 118 projecting over the lower surface of the rotational disc 116, the support rods 118 are secured to the rotational disc 116. Disc-like support blocks 120 are respectively engaged to the thread portions of the support rods 118 to be disposed horizontally.

A cylindrical fixed shaft 122, having an annular flange 121 at an intermediate portion thereof and provided with a thread portion in the outer surface of the lower portion thereof, is concentrically inserted into the cylinder 115 of the rotational disc 116 from the inside portion of the processing chamber 112 and then inserted into the hole 108 formed in the disc-like plate 110. The cylindrical fixed shaft 122 is secured to the disc-like plate 110 by fixing a nut 123 to a lower portion downwards projecting over the lower surface of the disc-like plate 110. Two bearings 124a and 124b are disposed in a space defined by the inner surface of the cylinder 115, the outer surface of the cylindrical fixed shaft 122, the annular flange 121 of the cylindrical fixed shaft 122 and the annular projection portion 109 of the disc-like plate 110, the bearings 124a and 124b being disposed vertically apart from each other for a required distance through an annular spacer 125. The lower surface of the bearing 124a is engaged to the upper surface of the annular engagement portion 117 formed in the inner surface adjacent to the lower portion of the cylinder 115, while the upper surface of the bearing 124b is engaged to the lower surface of the annular engagement portion 117. A rubber V-ring 126 is interposed between the inner surface of the upper portion of the cylinder 115 of the rotational disc 116 and the cylindrical fixed shaft 122 so as to prevent introduction of cleaning fluid injected from a bar-type high-frequency oscillation nozzle, to be described later, into a space between the inner surface of the cylinder 115 and the cylindrical fixed shaft 122 in which the bearings 124a and 124b are disposed.

A follower timing pulley 127 is attached to the outer surface of the lower portion of the cylinder 115 by a plurality of screws 128 so that the follower timing pulley 127 is secured to the cylinder 115. A drive timing pulley 129 is mounted on the drive shaft 101 of the motor 102 such that the drive timing pulley 129 is secured to the drive shaft 101 by an attaching member 130 attached between drive timing pulley 129 and the drive shaft 101. A timing belt 131 is arranged between the timing pulleys 127 and 129. Therefore, when the drive shaft 101 of the motor 102 is rotated and thus the drive timing pulley 129 secured to the drive shaft 101 is rotated, the rotational force is transmitted to the follower timing pulley 127 through the timing belt 131. As a result, the rotational disc 116 having the cylinder 115, to which the follower timing pulley 127 is attached, is rotated around the cylindrical fixed shaft 122.

The plural support rods 118, vertically secured to the rotational disc 116 and the disc-like support blocks 120, respectively attached to the upper ends of the support rods 118, form a holding means for horizontally holding a substrate required to be cleaned. The drive shaft 101, the motor 102, the rotational disc 116, the cylindrical fixed shaft 122, the bearings 124a and 124b, the timing pulleys 127 and 129 and the timing belt 131 form a rotating means for rotating the holding means.

A bar-type high-frequency oscillation nozzle 132 is secured to the top end of the cylindrical fixed shaft 122. As shown in FIGS. 9 and 10, the bar-type high-frequency oscillation nozzle 132 has a rectangular lower block 134 having an elongated recess 133 extending horizontally; and a rectangular upper block 137 having an upper surface in which an elongated cleaning-fluid discharge port 135 extending horizontally is formed and a lower surface in which an elongated nozzle hole 136 is formed which has an area smaller than that of the opening formed in the upper surface of the recess 133. The upper block 137 is, through a packing 138, fixed to the lower block 134 in such a manner that the nozzle hole 136 of the rectangular upper block 137 faces the recess 133 of the lower block 134. Since the rectangular upper block 137 is secured to the lower block 134 as described above, the portion including the rectangular upper block 137 around the nozzle hole 136 is, in the hood-like shape, allowed to project over the upper surface of the recess 133. The rectangular oscillation plate 139 is provided for the packing 138 on the lower surface of the hood-like portion of the rectangular upper block 137 allowed to project over the top surface of the recess 133. The rectangular cap 140 is disposed on the lower surface of the oscillation plate 139. By fixing screws (not shown) from the cap 140 to the hood-like portion of the rectangular upper block 137 through the oscillation plate 139, the oscillation plate 139 is secured between the recess 133 of the rectangular upper block 137 and the nozzle hole 136 of the rectangular upper block 137. The rectangular oscillator 141 is secured to the lower surface of the oscillation plate 139. A power supply cable 142 is inserted from the lower end of the cylindrical fixed shaft 122, and then allowed to pass through a cable fitting member 143 attached to the lower surface of the lower block 134. Then, the power supply cable 142 is allowed to pass through the lower block 134 to extend into the recess 133. The leading end of a main terminal 144 of the power supply cable 142 is connected to the oscillator 141. An earth terminal 145 coaxially attached to the power supply cable 142 is allowed to pass through the cap 140 so as to be connected to the oscillation plate 139. The power supply cable 142 is connected to a high-frequency oscillator (not shown). A first passage 145 for the cleaning fluid is subjected to spot facing so as to be opened in the upper and lower surfaces of the lower block 134. A second passage 146 is subjected to spot facing in the rectangular upper block 137. The second passage 146 is composed of a rising hole 147 opened in the lower surface of the rectangular upper block 137 so as to be communicated with the first passage 145, a cylindrical hole 148 formed in the lengthwise direction of the hole 147 and a plurality of cleaning-fluid discharge ports 149 diagonally opened from the cylindrical hole 148 toward the nozzle hole 136. A cleaning-fluid supply pipe 150 is inserted from the lower end of the cylindrical fixed shaft 122, and then allowed to pass through a fitting member 151 attached to the lower surface of the lower block 134 so as to be communicated with the first passage 145 in the lower block 134.

A bar-type shower nozzle 152 serving as a second cleaning-fluid injection means and having an L-shape cross section is disposed above the bar-type high-frequency oscillation nozzle 132. The shower nozzle 152 consists of a cleaning-fluid supply member 153, an elongated nozzle body 154 formed in the horizontal direction and connected to the cleaning-fluid supply member 153, a cleaning-fluid passage 155 formed in the nozzle body 154 and a plurality of injection ports 156 opened in the lower surface of the nozzle body 154.

The operation of the cleaning apparatus according to the sixth embodiment will now be described.

A substrate required to be cleaned, for example, the rectangular semiconductor wafer 157 is, by a single transfer method, transferred to the support block 120 attached to the four support rods 118 provided for the rotational disc 116 so as to be horizontally placed on the support blocks 120. The motor 102 is rotated to rotate the drive shaft 101 so as to rotate the drive-side timing pulley 129 secured to the drive shaft 101. Thus, the rotational force of the motor 102 is transmitted to the follower timing pulley 127 through the timing belt 131. As a result, the rotational disc 116 having the cylinder 115, to which the follower timing pulley 127 is attached, is rotated around the cylindrical fixed shaft 122. Thus, the semiconductor wafer 157 placed on the support blocks 120 at the top ends of the four support rods 118 secured to the rotational disc 116 are rotated.

While rotating the semiconductor wafer 157 as described above, cleaning fluid, for example, pure water is supplied to the cleaning-fluid supply pipe 150 inserted into the cylindrical fixed shaft 122. Thus, pure water above is introduced into the first passage 145 and the second passage 146 in the bar-type high-frequency oscillation nozzle 132 communicated with the cleaning-fluid supply pipe 150 through the fitting member 151. Then, pure water is injected from the plural cleaning-fluid discharge ports 149 of the second passage 146 to the oscillation plate 139 in the rectangular nozzle hole 136 of the rectangular upper block 137. As a result, the nozzle hole 136 is filled with pure water above. When high frequency electric power is supplied to the oscillator 141 attached to the lower surface of the oscillation plate 139 disposed between the upper and lower blocks 134 and 137 through the power supply cable 142, the oscillator 141 oscillates with a required frequency. As a result, high-frequency acoustic waves traveling to the elongated cleaning-fluid discharge port 135 formed in the upper surface of the rectangular nozzle hole 136 of the rectangular upper block 137 are generated from the oscillation plate 139 to which the oscillator 141 is attached. As a result, pure water with high-frequency acoustic waves is, as shown in FIGS. 8 and 10, zonally injected from the elongated discharge port 135 of the upper block 137 to the reverse side surface of the rotating semiconductor wafer 157. At this time, high-frequency acoustic waves above penetrate the semiconductor wafer 157. Simultaneously, cleaning fluid, for example, pure water is supplied to the cleaning-fluid supply member 153 of the shower nozzle 152 disposed above the semiconductor wafer 157 so as to be introduced into the cleaning-fluid passage 155 of the nozzle body 154. As a result, pure water is zonally injected to the surface of the rotating semiconductor wafer 157 from the plural injection ports 156 formed in the lower portion of the nozzle body 154. Note that pure water injected from the respective nozzles 132 and 152 and used to clean the reverse and right sides of the semiconductor wafer 157 is accumulated in the processing chamber 112 so as to be discharged to the outside of the apparatus through the discharge pipe 114.

As described above, while operating the holding means and the rotating means to horizontally hold and rotate the semiconductor wafer 157, pure water with high-frequency acoustic waves capable of penetrating the semiconductor wafer 157 is zonally injected from the bar-type high-frequency oscillation nozzle 132 disposed below the semiconductor wafer 157 to the reverse side of the semiconductor wafer 157. As a result, particles on the overall reverse side of the semiconductor wafer 157 can be cleaned with pure water above. Moreover, re-adhesion of particles can be prevented so that precise cleaning is performed.

When pure water is, with high-frequency acoustic waves, zonally injected from the bar-type high-frequency oscillation nozzle 132 to the reverse side of the semiconductor wafer 157 and simultaneously when pure water is zonally injected from the shower nozzle 152 disposed above the semiconductor wafer 157 to the surface of the semiconductor wafer 157, high-frequency acoustic waves emitted from the bar-type high-frequency oscillation nozzle 132 penetrate the semiconductor wafer 157 to also act on particles existing on the reverse side of the semiconductor wafer 157. Liquid films of pure water injected from the shower nozzle 152 clean the particles. High-frequency acoustic waves which have reached the liquid film are reflected by an air layer having a considerably different acoustic impedance so that high-frequency acoustic waves are allowed to pass through the semiconductor wafer 157 and then returned to the reverse side of the semiconductor wafer 157. High-frequency acoustic waves returned to the reverse side of the semiconductor wafer 157 repeat similar reflections and decays. As described above, pure water is injected from the shower nozzle 152 to the surface of the semiconductor wafer 157 and thus the liquid film is formed. Thus, also the overall surface of the semiconductor wafer 157 can precisely be cleaned without a necessity of disposing a high-frequency oscillation nozzle above the semiconductor wafer 157, that is, a necessity of disposing the same to face the right side of the semiconductor wafer 157.

Therefore, the cleaning apparatus according to the sixth embodiment is able to simultaneously and precisely clean the two sides of the semiconductor wafer 157.

Moreover, the cleaning apparatus according to the sixth embodiment has the structure such that the shower nozzle 152 is disposed above the semiconductor wafer 157. Therefore, the shower nozzle 152 disposed above the semiconductor wafer can be disposed apart from the surface of the semiconductor wafer 157 for a satisfactory long distance as is not disposed near the same in the structure according to the first embodiment. As a result, the cleaned semiconductor wafer 157 can easily be taken out from the holding means. Thus, the handling facility of the apparatus can be improved.

Since the cleaning apparatus according to the sixth embodiment has the structure such that the drive member for reciprocating the high-frequency oscillation nozzle is not disposed above the semiconductor wafer 157 as is disposed in the structure according to the first embodiment, contamination of the semiconductor wafer 157 attributable to falling of particles from the drive member can be prevented.

In the bar-type high-frequency oscillation nozzle 132, pure water is injected from the plural cleaning-fluid discharge ports 149 of the second passage 146 in the rectangular upper block 137 to the oscillation plate 139 in the rectangular nozzle hole 136 so that air bubbles are not introduced into the surface layer of the oscillation plate 139. As a result, the oscillation plate 139 can efficiently be oscillated when the oscillator 141 is oscillated. Thus, high-frequency acoustic waves propagating to the elongated discharge port 135 can be generated.

Although pure water is employed as the cleaning fluid in the first to sixth embodiments, another chemical fluid may be employed.

Although the silicon wafer is employed as the substrate required to be cleaned, the present invention may similarly be applied to a liquid crystal glass substrate, a semiconductor wafer, a magnetic disk or the like.

As described above, according to the present invention, the cleaning apparatus can be provided with which the two sides of a substrate required to be cleaned, such as a silicon wafer, can simultaneously and precisely be cleaned. Moreover, contamination of the substrate required to be cleaned from the reverse side can be prevented. Thus, precise and high density semiconductor apparatuses, liquid crystal glass substrates or magnetic disks can effectively be manufactured.

According to the present invention, the small cleaning apparatus can be provided which is not required to use a large-size shielding member, capable of preventing re-contamination of the substrate required to be cleaned, such as silicon wafer, attributable to splash of the cleaning fluid, and adaptable to a process for manufacturing precise and high density semiconductor apparatuses, liquid crystal glass substrates and magnetic disks which must be cleaned with significant purity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A cleaning apparatus comprising:

holding means for horizontally holding a substrate required to be cleaned having a rotation support member;

rotating means for rotating said holding means having a cylindrical fixed shaft and a drive mechanism for rotating said rotation support member around said fixed shaft;

first cleaning-fluid injection means disposed below said holding means to zonally inject cleaning fluid with high-frequency acoustic waves to the reverse side of said substrate supported by said holding means; and second cleaning-fluid injection means disposed above said holding means to inject cleaning fluid to the surface of said substrate supported by said holding means, wherein said first cleaning-fluid injection means has a rectangular block secured to the upper end of said cylindrical fixed shaft and having, in the upper surface thereof, a rectangular nozzle hole having an elongated cleaning-fluid discharge port, an oscillator, in said block, disposed adjacent to the bottom portion of said nozzle hole to face said discharge port so as to be connected to a power supply cable introduced through said cylindrical fixed shaft and a cleaning-fluid passage formed in said block so as to be communicated with said nozzle hole and connected to a cleaning-fluid supply pipe introduced through said cylindrical fixed shaft.

2. The apparatus according to claim 1, wherein said drive mechanism has a follower timing pulley attached to said rotation support member, a drive timing pulley, a timing belt arranged between said pulleys and a motor for rotating said drive timing pulley.

3. The apparatus according to claim 1, wherein said second cleaning-fluid injection means is a shower nozzle having a cleaning-fluid supply member, a horizontally-elongated nozzle body connected to the lower end of said supply member and having a cleaning-fluid passage portion and a plurality of cleaning-fluid injection ports opened in the bottom portion of said nozzle body so as to be communicated with said cleaning-fluid passage portion.

* * * * *